United States Patent
Sato

(10) Patent No.: US 8,241,830 B2
(45) Date of Patent: Aug. 14, 2012

(54) POSITIVE RESIST COMPOSITION AND A PATTERN FORMING METHOD USING THE SAME

(75) Inventor: Kenichiro Sato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 471 days.

(21) Appl. No.: 11/504,040

(22) Filed: Aug. 15, 2006

(65) Prior Publication Data

US 2007/0042291 A1    Feb. 22, 2007

(30) Foreign Application Priority Data

Aug. 16, 2005  (JP) .............................. P.2005-235801

(51) Int. Cl.
*G03F 7/004* (2006.01)
*G03F 7/039* (2006.01)
*G03F 7/26* (2006.01)

(52) U.S. Cl. ..................... 430/270.1; 430/326
(58) Field of Classification Search .............. 430/270.1, 430/326
See application file for complete search history.

(56) References Cited

U.S. PATENT DOCUMENTS

| | | | |
|---|---|---|---|
| 5,561,194 A | 10/1996 | Cornett et al. | |
| 6,008,265 A | 12/1999 | Vallee et al. | |
| 6,008,267 A | 12/1999 | Vallee et al. | |
| 6,358,665 B1 * | 3/2002 | Pawlowski et al. | 430/270.1 |
| 2003/0148211 A1 * | 8/2003 | Kamabuchi et al. | 430/270.1 |
| 2004/0033437 A1 | 2/2004 | Uenishi | |
| 2004/0072097 A1 * | 4/2004 | Kodama | 430/270.1 |
| 2005/0238992 A1 * | 10/2005 | Kodama | 430/270.1 |
| 2006/0063102 A1 * | 3/2006 | Kubota et al. | 430/270.1 |
| 2006/0166135 A1 * | 7/2006 | Wada | 430/270.1 |

FOREIGN PATENT DOCUMENTS

| | | |
|---|---|---|
| EP | 1033624 A1 | 9/2000 |
| EP | 1091250 A1 | 4/2001 |
| JP | 7-209868 A | 8/1995 |
| JP | 9-73173 A | 3/1997 |
| JP | 10-226707 A | 8/1998 |
| JP | 2001-166474 A | 6/2001 |
| JP | 2001-166478 A | 6/2001 |
| JP | 2001-194792 A | 7/2001 |
| JP | 2003-107708 A | 4/2003 |
| JP | 2003-322964 A | 11/2003 |
| JP | 2003-345023 A | 12/2003 |
| JP | 2004-029437 * | 1/2004 |
| JP | 2004-029437 A | 1/2004 |
| WO | 00/08525 A1 | 2/2000 |
| WO | 2004-040371 A2 | 5/2004 |
| WO | WO 2004/051375 * | 6/2004 |

OTHER PUBLICATIONS

Japanese Office Action issued in Japanese Application No. 2005-235801, dated Apr. 13, 2010.
Extended European Search Report issued Nov. 3, 2011, in Application No. 06016530.5.

* cited by examiner

*Primary Examiner* — Anca Eoff
(74) *Attorney, Agent, or Firm* — Sughrue Mion, PLLC

(57) ABSTRACT

A positive resist composition comprises (A) a compound capable of generating sulfonic acid, bis(alkylsulfonyl)amide, or tris(alkylsulfonyl)methine upon irradiation with actinic ray or radiation, and (B) a resin capable of increasing the solubility in an alkali developer by action of an acid having specific repeating units, and a pattern forming method using the same.

9 Claims, No Drawings

POSITIVE RESIST COMPOSITION AND A PATTERN FORMING METHOD USING THE SAME

BACKGROUND OF THE INVENTION

1. Field of the Invention

The present invention relates to a positive resist composition suitably used in super micro lithography processes such as the manufacture of super LSI and high capacity microchips, and other photo-fabrication processes, and a pattern forming method using the same. More specifically, the invention relates to a positive resist composition capable of forming a highly precise pattern with KrF excimer laser rays, electron beams, EUV rays, etc., and a pattern forming method using the same.

2. Description of the Related Art

In the manufacturing process of semiconductor devices such as IC and LSI, fine processing by lithography with resist compositions has been conventionally performed. In recent years, with the increment of integration of integrated circuits, ultrafine pattern formation of the level of sub-micron and quarter-micron has come to be required. Under such a circumstance, the exposure wavelengths show a tendency to be shortening, such as from g-ray to i-ray, further to KrF excimer laser rays. Nowadays, further, the development of lithography using electron beams, X-rays or EUV rays, in addition to excimer laser rays, has been advanced.

As the resists suitable for far ultraviolet rays such as KrF excimer lasers, electron beams, X-rays, or EUV rays, "chemical amplification resists" using a radiation-sensitive acid generator capable of generating an acid upon irradiation (hereinafter also referred to as "exposure") with actinic ray or radiation to increase sensitivity of the resists by means of the catalytic action of the generated acid are proposed. As the problem peculiar to such chemical amplification resists, the line width change of a resist pattern or T-shape formation due to the fluctuation of post exposure time delay (hereinafter also referred to as "PED") from exposure to heating treatment after exposure has been conventionally pointed out. However, in late years, various kinds of chemical amplification resists applicable to the manufacture of devices have been proposed including a chemical amplification type radiation-sensitive resin composition using a polymer comprising a hydroxystyrene repeating unit, a t-butyl (meth)acrylate repeating unit, and a repeating unit lowering the solubility of the polymer in an alkali developer after exposure (JP-A-7-209868). However, with the trend of fining of devices of the present state, de-protective groups (a t-butyl protective group, etc.) ordinarily used in chemical amplification resists cannot reveal sufficient contrast, so that it is difficult for these resist compositions to be applied to the manufacture of devices of pattern size finer than now.

In this connection, some resist compositions are known, in which phenolic acid-decomposable resins obtained by copolymerization of acid-decomposable acrylate monomers having an alicyclic group as the de-protective group in place of a t-butyl protective group, etc., are used. For example, positive resist compositions disclosed in U.S. Pat. No. 5,561,194, JP-A-9-73173, JP-A-2001-166474, JP-A-2001-166478, JP-A-2003-107708 and JP-A-2001-194792 can be exemplified as these resist compositions. It is disclosed in JP-A-9-73173 that these resist compositions using acid-decomposable resins having such a de-protective group reveal high resolution.

On the other hand, line edge roughness increases in the degree of importance in late years with the progress of fining. Line edge roughness is minute irregularities of a nanometer scale formed on the sidewall of a pattern when fine lines are formed. Line edge roughness influences line width control, i.e., electrical characteristics of devices.

The above resist compositions using phenolic acid-decomposable resins obtained by copolymerization of acid-decomposable acrylate monomers having an alicyclic group as the de-protective group are not satisfactory with respect to line edge roughness. In addition, further improvement has been required in the point of line width change attendant upon variation of exposure amount, i.e., exposure latitude.

SUMMARY OF THE INVENTION

An object of the invention is to solve the technical problems in fine processing of semiconductor elements using actinic ray or radiation, in particular KrF excimer laser rays, electron beams, or EUV rays, that is, an object of the invention is to provide a positive resist composition showing good line edge roughness and exposure latitude, and another object is to provide a pattern forming method using the same.

The present invention can be achieved by the following constitutions.

(1) A positive resist composition containing:

(A) a compound capable of generating sulfonic acid, bis(alkylsulfonyl)amide, or tris(alkylsulfonyl)methine upon irradiation with actinic ray or radiation, and (B) a resin capable of increasing its solubility in an alkali developer by action of an acid, the resin comprising a repeating unit represented by the following formula (a), and a repeating unit represented by the following formula (b),

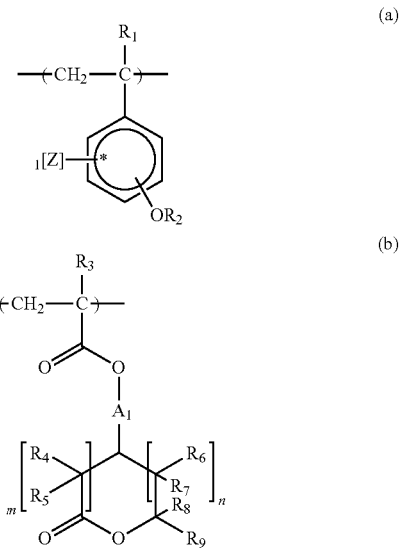

in formulae (a) and (b), $R_1$ represents a hydrogen atom or an alkyl group; $R_2$ represents a hydrogen atom or $CHR_{10}$—$OR_{11}$, where $R_{10}$ represents a hydrogen atom, an alkyl group, a cycloalkyl group, or an aralkyl group, $R_{11}$ represents an alkyl group, a cycloalkyl group, or an aralkyl group, and $R_{10}$ and $R_{11}$ may be bonded to each other to form a cyclic structure; Z represents a hydroxyl group, a halogen atom, a cyano group, a nitro group, an alkyl group, a cycloalkyl group, an aryl group, an alkoxyl group, an acyl group, or an acyloxy group; $R_3$ represents a hydrogen atom or an alkyl group; $A_1$ represents a single bond or a divalent linking group; $R_4$ and $R_5$ each represents a hydrogen atom, a halogen atom, an alkyl group, or an alkoxyl group; $R_6$, $R_7$, $R_8$ and $R_9$ each represents a hydrogen atom, a halogen atom, an alkyl group, or an alkoxyl group, $R_6$ or $R_7$, and $R_8$ or $R_9$ may be bonded to each other to form a cyclic structure; l represents from 0 to 4; m represents 0 or 1; and n represents 0 or 1, provided that m+n represents 1 or 2.

(2) The positive resist composition as described in the above item (1), wherein the resin of component (B) has a repeating unit having a partial structure containing alicyclic hydrocarbon represented by any of the following formulae (pI) to (pVI):

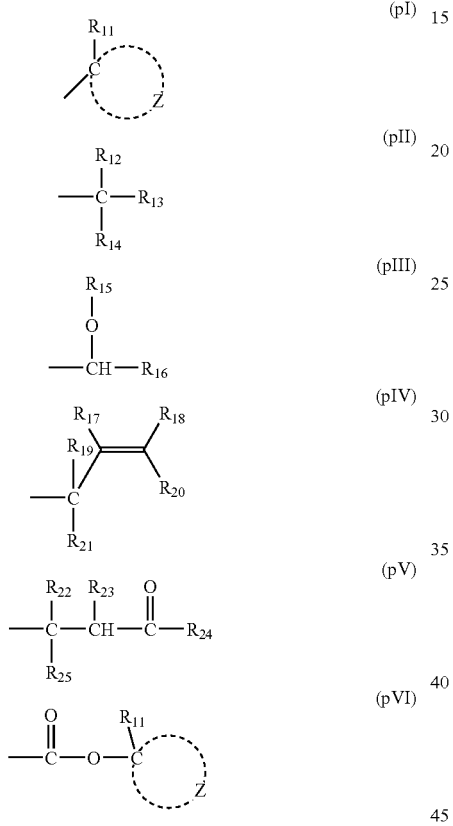

in formulae (pI) to (pVI), $R_{11}$ represents a methyl group, an ethyl group, an n-propyl group, an isopropyl group, an n-butyl group, an isobutyl group, or a sec-butyl group; Z represents an atomic group necessary to form an alicyclic hydrocarbon group together with a carbon atom; $R_{12}$, $R_{13}$, $R_{14}$, $R_{15}$ and $R_{16}$ each represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group; $R_{17}$, $R_{18}$, $R_{19}$, $R_{20}$ and $R_{21}$, each represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

(3) A pattern forming method comprising: forming a resist film with the positive resist composition as described in the above item (1) or (2); and exposing and developing the resist film.

DETAILED DESCRIPTION OF THE INVENTION

The invention is described in detail below.

Incidentally, in the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] (B) Resins Capable of Increasing the Solubility in an Alkali Developer by the Action of an Acid Having a Repeating Unit Represented by Formula (a), and a Repeating Unit Represented by Formula (b):

A resin capable of increasing the solubility in an alkali developer by the action of an acid (also referred to as "resin of component (B)") for use in the invention has a repeating unit represented by the following formula (a), and a repeating unit represented by the following formula (b).

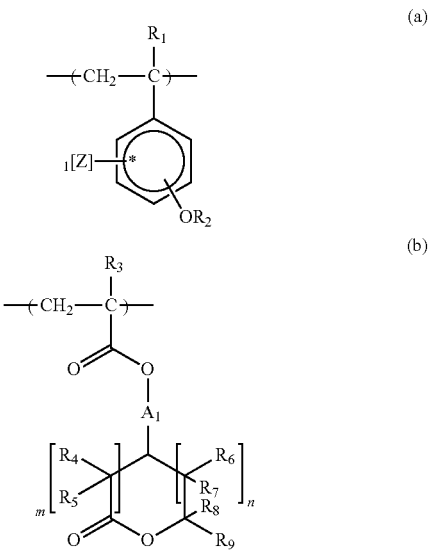

In formulae (a) and (b), $R_1$ represents a hydrogen atom or an alkyl group; $R_2$ represents a hydrogen atom or $CHR_{10}$—$OR_{11}$, where $R_{10}$ represents a hydrogen atom, an alkyl group, a cycloalkyl group, or an aralkyl group; $R_{11}$ represents an alkyl group, a cycloalkyl group, or an aralkyl group, and $R_{10}$ and $R_{11}$ may be bonded to each other to form a cyclic structure; Z represents a hydroxyl group, a halogen atom, a cyano group, a nitro group, an alkyl group, a cycloalkyl group, an aryl group, an alkoxyl group, an acyl group, or an acyloxy group; $R_3$ represents a hydrogen atom or an alkyl group; $A_1$ represents a single bond or a divalent linking group; $R_4$ and $R_5$ each represents a hydrogen atom, a halogen atom, an alkyl group, or an alkoxyl group; $R_6$, $R_7$, $R_8$ and $R_9$ each represents each represents a hydrogen atom, a halogen atom, an alkyl group, or an alkoxyl group, $R_6$ or $R_7$, and $R_8$ or $R_9$ may be bonded to each other to form a cyclic structure; E represents from 0 to 4; m represents 0 or 1; and n represents 0 or 1, provided that m+n represents 1 or 2.

The alkyl group represented by $R_1$ in formula (a) is preferably a straight chain or branched alkyl group having from 1 to 5 carbon atoms, e.g., a methyl group, an ethyl group, an n-propyl group, an isopropyl group, an n-butyl group, an isobutyl group, a sec-butyl group, a pentyl group, an isopentyl group, a neopentyl group, a t-pentyl group, etc., can be exemplified. The alkyl group represented by $R_1$ and $R_3$ may have a substituent, e.g., a halogen atom, a hydroxyl group, etc.

The alkyl group represented by $R_{10}$ and $R_{11}$ is preferably a straight chain or branched alkyl group having from 1 to 15 carbon atoms, e.g., a methyl group, an ethyl group, an n-propyl group, an isopropyl group, an n-butyl group, an isobutyl group, a sec-butyl group, a pentyl group, an isopentyl group, a neopentyl group, a t-pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, etc., can be exemplified.

The cycloalkyl group represented by $R_{10}$ and $R_{11}$ may be monocyclic or polycyclic. As the monocyclic cycloalkyl group, a cycloalkyl group having from 3 to 8 carbon atoms is preferred, e.g., a cyclopropyl group, a cyclobutyl group, a cyclopentyl group, a cyclohexyl group, a cyclooctyl group, etc., can be exemplified. As the polycyclic cycloalkyl group, a cycloalkyl group having from 6 to 20 carbon atoms is preferred, e.g., an adamantyl group, a norbornyl group, an isoboronyl group, a camphanyl group, a dicyclopentyl group, an α-pinel group, a tricyclodecanyl group, a tetracyclododecyl group, an androstanyl group, etc., can be exemplified. Incidentally, the carbon atoms in the cycloalkyl group may be partially substituted with a hetero atom such as an oxygen atom.

The aralkyl group represented by $R_{10}$ and $R_{11}$ is preferably an aralkyl group having from 7 to 12 carbon atoms, e.g., a benzyl group, a phenethyl group, a naphthylmethyl group, etc., can be exemplified.

$R_{10}$ and $R_{11}$, may be bonded to each other to form a cyclic structure. As the cyclic structure formed by $R_{10}$ and $R_{11}$ by bonding to each other, a 5- or 6-membered ring can be exemplified.

$R_{10}$ and $R_{11}$ may have a substituent, such as a hydroxyl group, a carboxyl group, a halogen atom, an alkoxyl group, an acyl group, an acyloxy group, an alkoxycarbonyl group, a cyano group, a nitro group, etc.

As the alkyls group represented by Z, the same alkyl groups as represented by $R_{10}$ can be exemplified.

As the cycloalkyl groups represented by Z, the same cycloalkyl groups as represented by $R_{10}$ can be exemplified The aryl group represented by Z is preferably an aryl group having from 6 to 14 carbon atoms, e.g., a phenyl group, a naphthyl group, an anthryl group, a phenanthryl group, a biphenyl residue (a group formed by removing one hydrogen atom from biphenyl), a p-terphenyl residue (a group formed by removing one hydrogen atom from p-terphenyl), etc., can be exemplified.

The alkoxyl group represented by Z is preferably an alkoxyl group having from 1 to 10 carbon atoms, e.g., a methoxy group, an ethoxy group, an n-propoxy group, an isopropoxy group, a butoxy group, a pentyloxy group, a hexyloxy group, a heptyloxy group, etc., can be exemplified.

The acyl group represented by Z is preferably an acyl group having from 1 to 8 carbon atoms, e.g., a formyl group, an acetyl group, a propionyl group, a butyryl group, a valeryl group, a pivaloyl group, a benzoyl group, etc., can be exemplified.

The acyloxy group represented by Z is preferably an acyloxy group having from 2 to 8 carbon atoms, e.g., an acetoxy group, a propionyloxy group, a butyryloxy group, a valeryloxy group, a pivaloyloxy group, a hexanoyloxy group, an octanoyloxy group, a benzoyloxy group, etc., can be exemplified.

Z may have a substituent, such as a hydroxyl group, a carboxyl group, a halogen atom, an alkoxyl group, an acyl group, an acyloxy group, an alkoxycarbonyl group, a cyano group, a nitro group, etc.

In the repeating unit represented by formula (a), the —O—$CHR_{10}$—$OR_{11}$ group is decomposed by the action of an acid and the —$CHR_{10}$—$OR_{11}$ group is desorbed to form a hydroxyl group, so that solubility in an alkali developer increases.

$R_3$ in formula (b) is equivalent to $R_1$ in formula (a).

As the divalent linking group represented by $A_1$, an alkylene group, a cycloalkylene group, etc., can be exemplified. The alkylene group represented by $A_1$ is preferably a straight chain or branched alkylene group having from 1 to 8 carbon atoms, e.g., a methylene group, an ethylene group, a propylene group, a butylene group, a hexylene group, an octylene group, etc., can be exemplified. The cycloalkylene group represented by $A_1$ is preferably a cycloalkylene group having from 5 to 12 carbon atoms, e.g., monocyclic residues such as a cyclopentylene group, a cyclohexylene group, etc., and polycyclic residues such as a normornane skeleton, adamantane skeleton, etc., can be exemplified.

$A_1$ is preferably a single bond.

As the alkyl groups represented by $R_4$, $R_5$, $R_6$ to $R_9$, the same alkyl groups as represented by $R_{10}$ in formula (a) can be exemplified.

As the alkoxyl groups represented by $R_4$, $R_5$, $R_6$ to $R_9$, the same alkoxyl groups as represented by Z in formula (a) can be exemplified.

$R_4$, $R_5$, $R_6$ to $R_9$ may further have a substituent, such as a hydroxyl group, a carboxyl group, a halogen atom, an alkoxyl group, an acyl group, an acyloxy group, an alkoxycarbonyl group, a cyano group, a nitro group, etc.

The cyclic structure formed by $R_6$ or $R_7$, and $R_8$ or $R_9$ by bonding to each other is preferably a cyclic structure having an oxygen atom. The cyclic structure having an oxygen atom may be monocyclic or polycyclic, preferably a 4- to 8-membered ring, and more preferably a 5- or 6-membered ring. The number of oxygen atom of the cyclic structure is preferably 1 or 2. As the cyclic structure to be formed, e.g., structures in which at least one methylene group constituting the cyclic skeleton in a corresponding carbon ring such as pentane, norbornene, and the like is substituted with an oxygen atom can be exemplified. The cyclic structure may be substituted with an alkyl group, a hydroxyl group, etc.

The specific examples of the repeating units represented by formula (a) are shown below, but the invention is not restricted thereto.

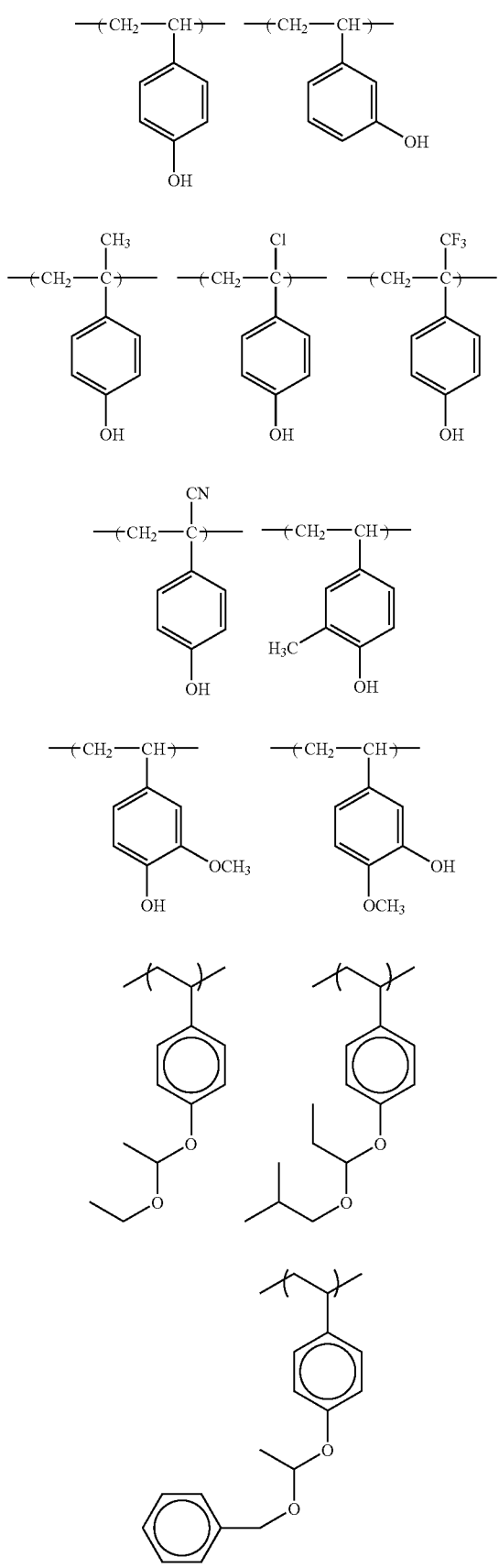
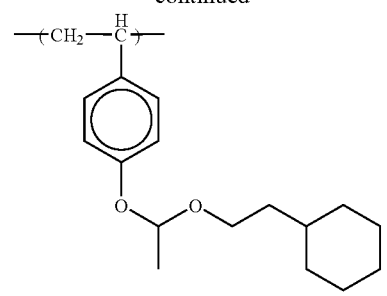
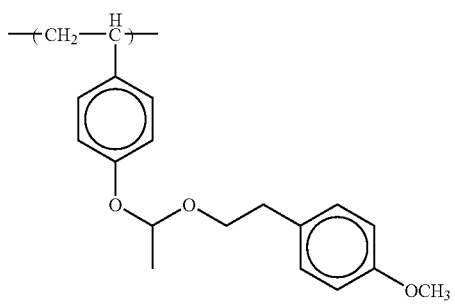
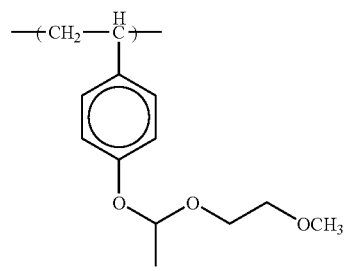
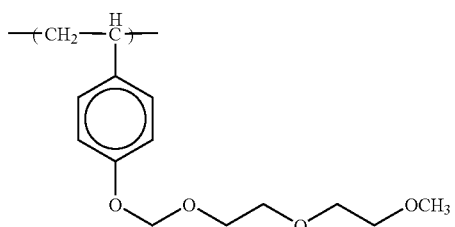
The specific examples of the repeating units represented by formula (b) are shown below, but the invention is not restricted thereto.
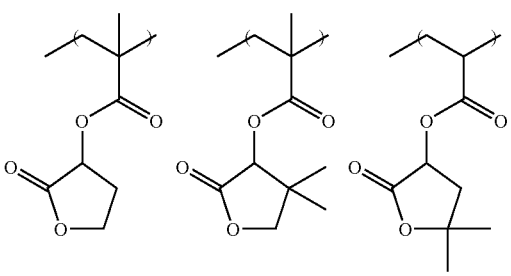

-continued

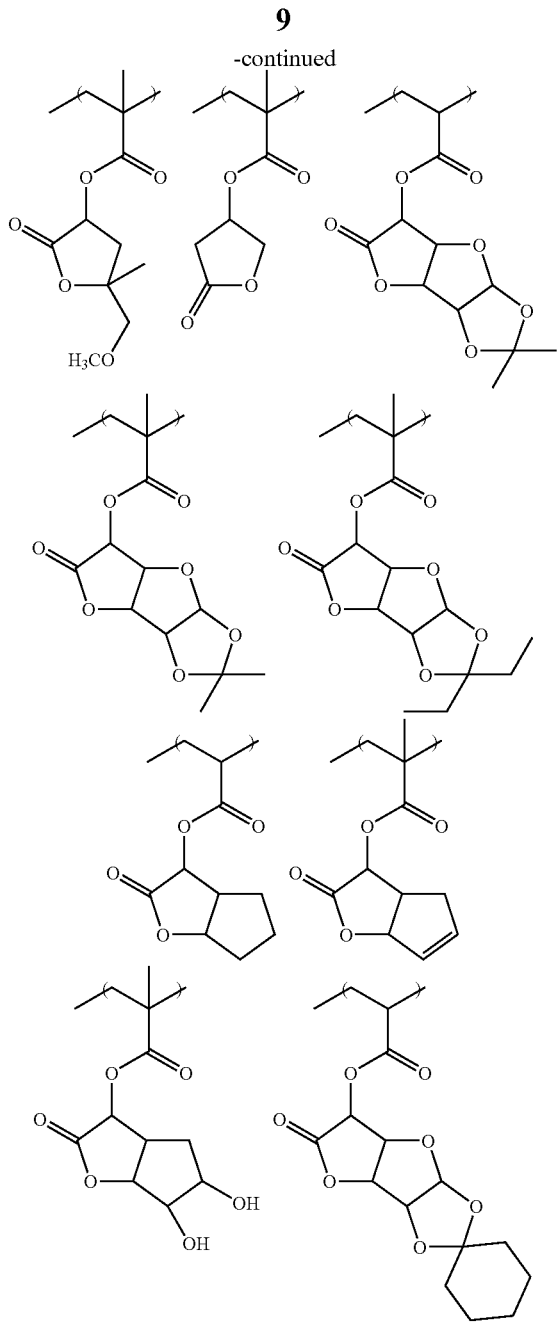

It is preferred for the resin of component (B) to further have a repeating unit having a group having a partial structure containing alicyclic hydrocarbon represented by any of the following formulae (pI) to (pVI).

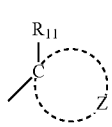
(pI)

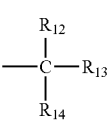
(pII)

-continued

(pIII)

(pIV)

(pV)

(pVI)

In formulae (pI) to (pVI), $R_{11}$ represents a methyl group, an ethyl group, an n-propyl group, an isopropyl group, an n-butyl group, an isobutyl group, or a sec-butyl group; Z represents an atomic group necessary to form an alicyclic hydrocarbon group together with a carbon atom; $R_{12}$, $R_{13}$, $R_{14}$, $R_{15}$ and $R_{16}$ each represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group; $R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

In formulae (pI) to (pVI), the alkyl group represented by $R_{12}$ to $R_{25}$ is a substituted or unsubstituted, straight chain or branched alkyl group having from 1 to 4 carbon atoms, e.g., a methyl group, an ethyl group, an n-propyl group, an isopropyl group, an n-butyl group, an isobutyl group, a sec-butyl group, a t-butyl group, etc., are exemplified.

As the examples of further substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, a nitro group, etc., can be exemplified.

The alicyclic hydrocarbon groups represented by $R_{12}$ to $R_{25}$ or the alicyclic hydrocarbon group formed by Z together with carbon atoms may be monocyclic or polycyclic. Specifically, groups having a monocyclic, bicyclic, tricyclic or tetracyclic structure having 5 or more carbon atoms can be exemplified. The number of carbon atoms of these alicyclic hydrocarbon groups is preferably from 6 to 30, and especially preferably from 7 to 25. These alicyclic hydrocarbon groups may have a substituent.

Of the alicyclic hydrocarbon groups, the examples of the structures of the alicyclic part are shown below.
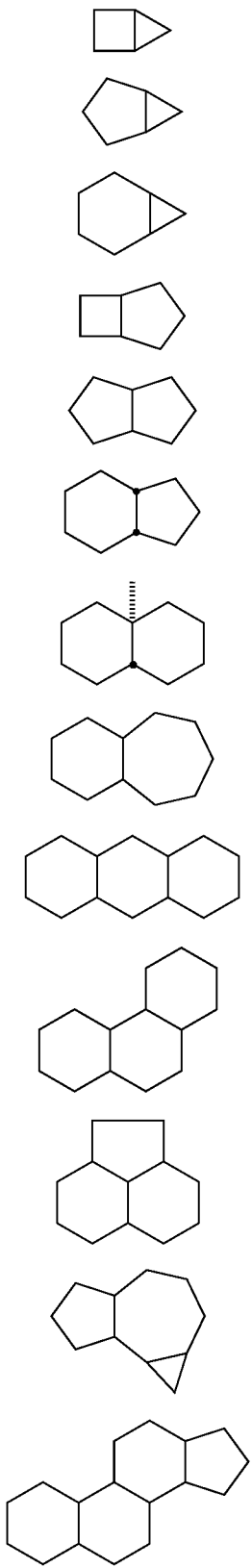
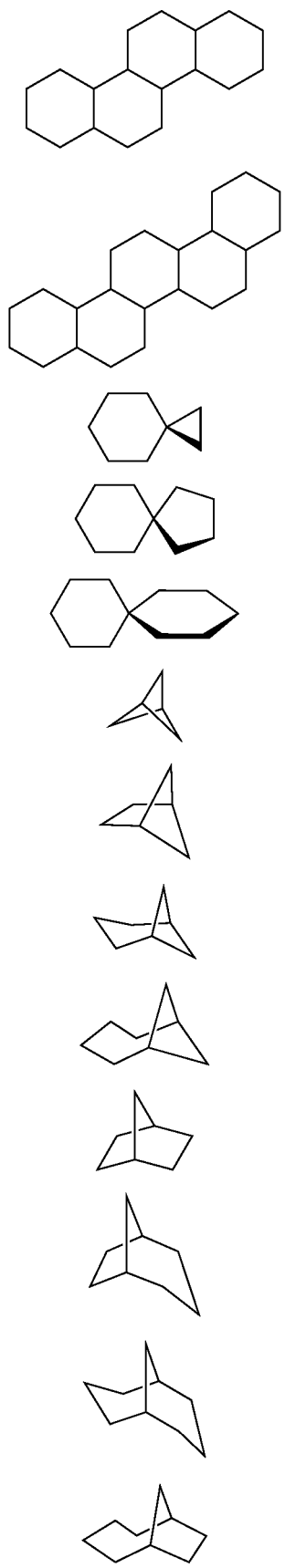

(27) 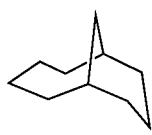

(28) 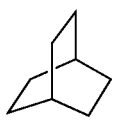

(29) 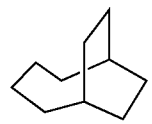

(30) 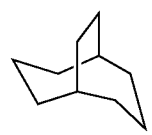

(31) 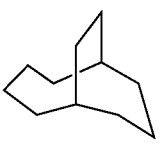

(32) 

(33) 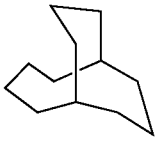

(34) 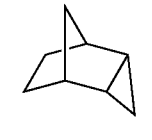

(35) 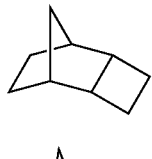

(36) 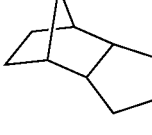

(37) 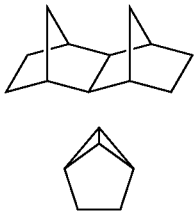

(38)

(39) 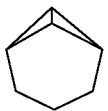

(40) 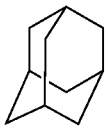

(41) 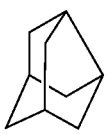

(42) 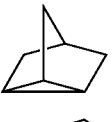

(43) 

(44) 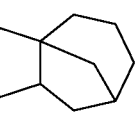

(45) 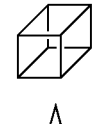

(46) 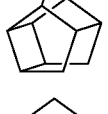

(47) 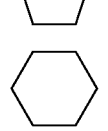

(48) 

(49) 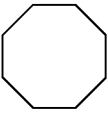

(50) 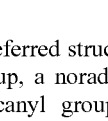

In the invention, preferred structures of the alicyclic part are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. More preferred structures are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these alicyclic hydrocarbon groups, an alkyl group, a halogen atom, a hydroxyl group, an alkoxyl group, a carboxyl group, and an alkoxycarbonyl group are exemplified. The alkyl group is preferably a lower alkyl group, e.g., a methyl group, an ethyl group, a propyl group, an isopropyl group, a butyl group, or the like, and more preferably a methyl group, an ethyl group, a propyl group, or an isopropyl group. As the alkoxyl group, an alkoxyl group having from 1 to 4 carbon atoms, e.g., a methoxy group, an ethoxy group, a propoxy group, a butoxy group, or the like can be exemplified. The alkyl group and the alkoxyl group may further have a substituent. As the further substituents of the alkyl group and the alkoxyl group, a hydroxyl group, a halogen atom and an alkoxyl group can be exemplified.

The repeating unit having a group having a partial structure containing alicyclic hydrocarbon represented by any of the following formulae (pI) to (pVI) is preferably represented by the following formula (c).

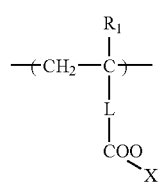

(c)

In formula (c), $R_1$ represents a hydrogen atom, a methyl group, a trifluoromethyl group, a cyano group, a chlorine atom, a hydroxymethyl group, or an alkoxymethyl group; L represents a single bond or a divalent linking group; and X represents a group having a partial structure containing alicyclic hydrocarbon represented by any of formulae (pI) to (pVI).

The divalent linking group represented by L in formula (c) has the same meaning as the divalent linking group represented by $A_1$ in formula (b).

L preferably represents a single bond.

In the repeating unit represented by formula (c), the —COO—X group is decomposed by the action of an acid and the —X group is desorbed to form a carboxyl group, so that solubility in an alkali developer increases.

The specific examples of monomers corresponding to the repeating unit having a group having a partial structure containing alicyclic hydrocarbon represented by any of formulae (pI) to (pVI) are shown below, but the invention is not restricted thereto.

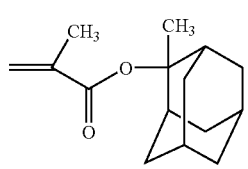

1

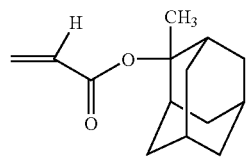

2

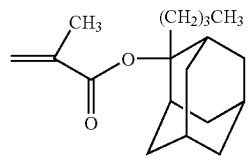

3

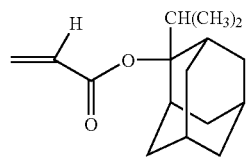

4

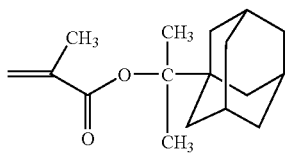

5

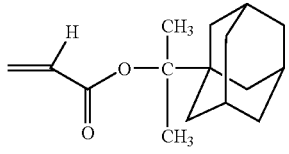

6

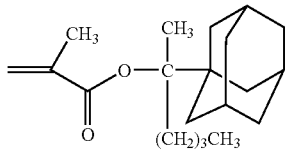

7

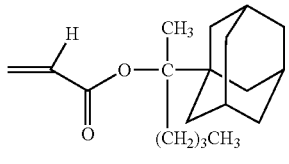

8

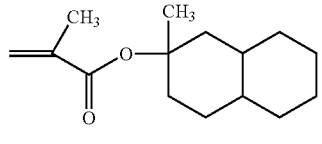

9

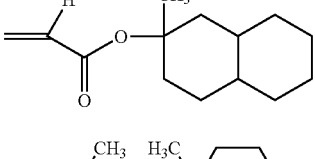

10

11

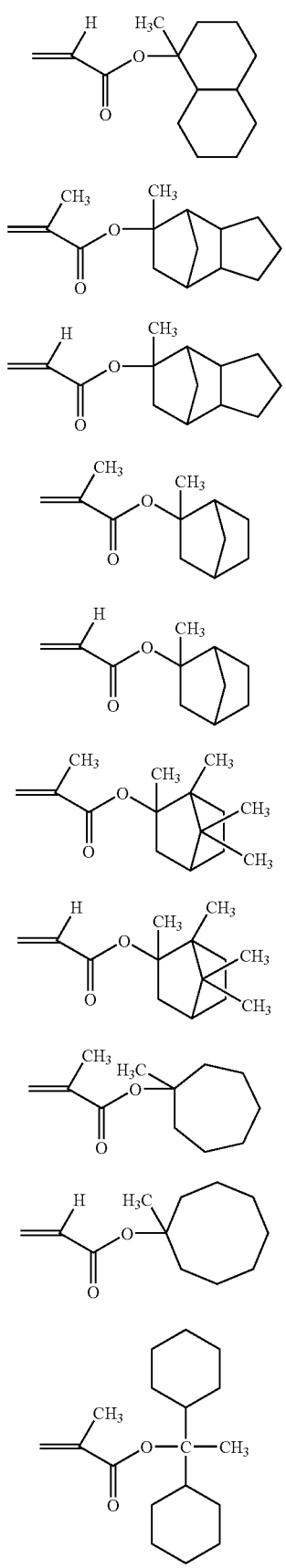
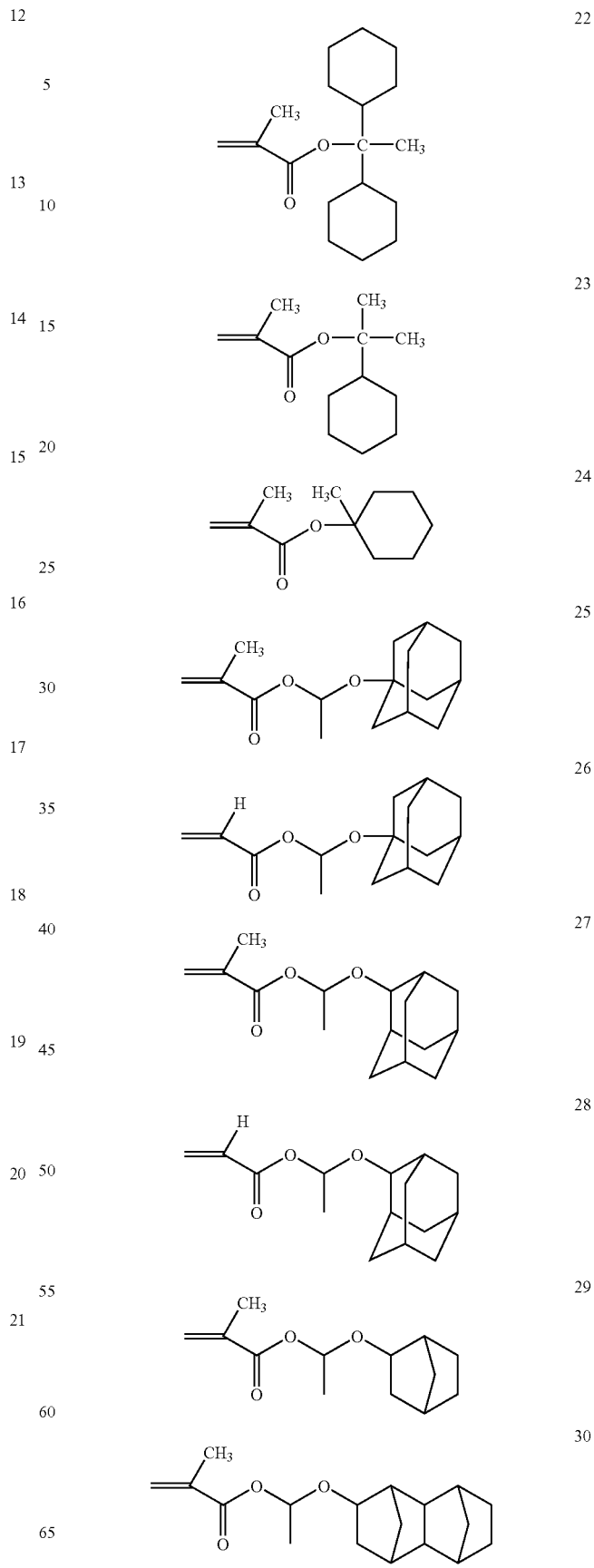

-continued

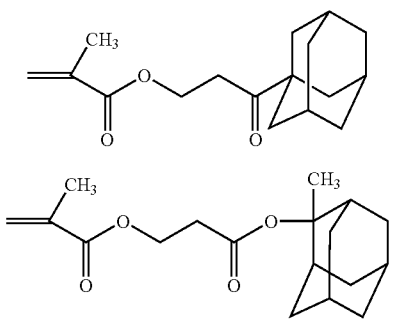

It is preferred for the resin of component (B) to have a repeating unit having an alicyclic hydrocarbon structure substituted with a polar group. As the polar group, a hydroxyl group and a cyano group are preferred. A repeating unit having a partial structure represented by the following formula (VIIa) or (VIIb) is preferred, and a repeating unit represented by the following formula (AIIa) or (AIIb) is more preferred.

(VIIa)

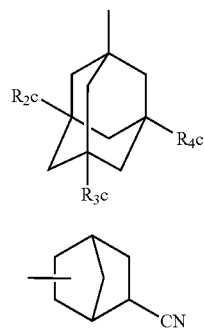

(VIIb)

In formula (VIIa), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group, preferably one or two of $R_{2c}$, $R_{3c}$ and $R_{4c}$ represent a hydroxyl group and the remainder represent a hydrogen atom, and more preferably two of $R_{2c}$, $R_{3c}$ and $R_{4c}$ represent a hydroxyl group and the remainder represents a hydrogen atom.

(AIIa)

(AIIb)

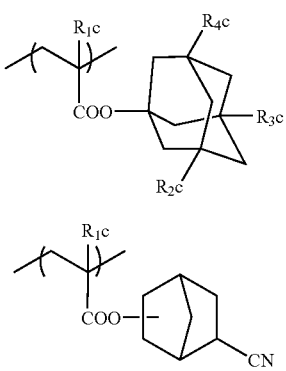

In formulae (AIIa) and (AIIb), $R_{1c}$ represents a hydrogen atom, a methyl group, a trifluoromethyl group, or a hydroxylmethyl group.

The specific examples of the repeating units having a structure represented by formula (VIIa) or (VIIb) are shown below, but the invention is not restricted thereto.

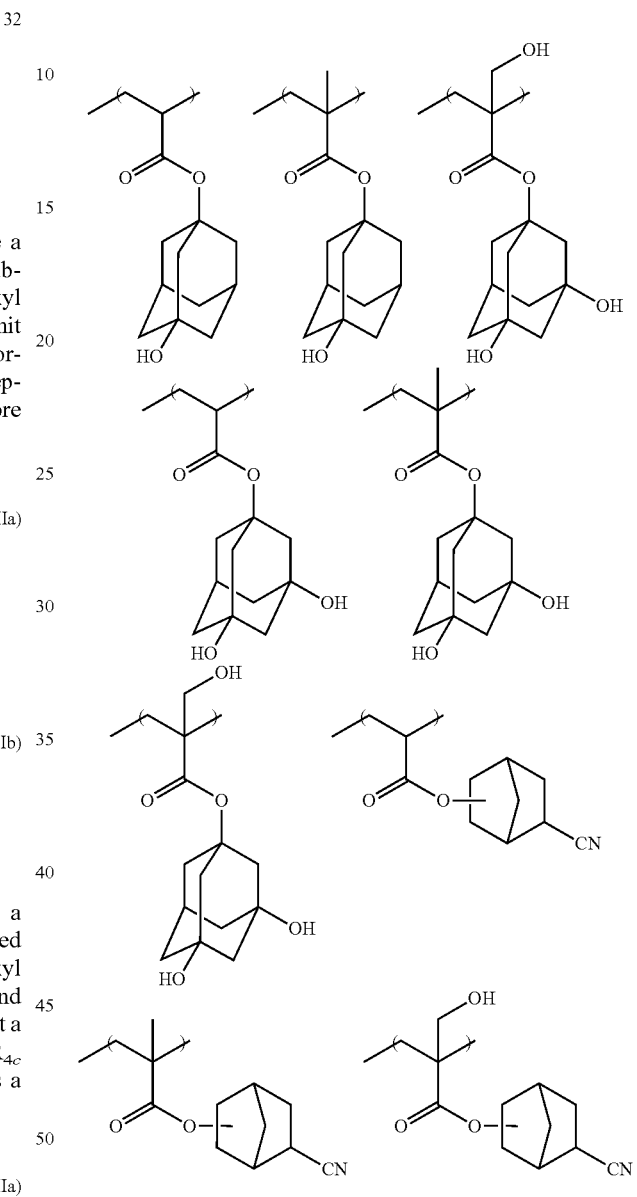

The resin of component (B) may further have a repeating unit having other group capable of increasing the solubility in an alkali developer by the action of an acid (hereinafter also referred to as "an acid-decomposable group"). As other acid-decomposable group, e.g., a group represented by —C(=O)—X$_1$—R$_0$ can be exemplified.

In the formula, R$_0$ represents a tertiary alkyl group, e.g., a t-butyl group, a t-amyl group, etc., an isoboronyl group, a 1-alkoxyethyl group, e.g., a 1-ethoxyethyl group, a 1-butoxyethyl group, a 1-isobutoxyethyl group, a 1-cyclohexyloxyethyl group, etc., an alkoxymethyl group, e.g., a 1-methoxymethyl group, a 1-ethoxymethyl group, etc., a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc., can be exemplified. $X_1$ represents an oxygen atom, a sulfur atom, —NH—, —NHSO$_2$— or —NHSO$_2$NH—.

In the resin of component (B), the content of the repeating unit having an acid-decomposable group is preferably from 15 to 50 mol % in all the repeating units, and more preferably from 20 to 40 mol %.

In the resin of component (B), the content of the repeating unit represented by formula (a) is preferably from 20 to 75 mol % in all the repeating units, and more preferably from 25 to 70 mol %.

In the resin of component (B), the content of the repeating unit represented by formula (b) is preferably from 3 to 50 mol % in all the repeating units, and more preferably from 5 to 40 mol %.

The weight average molecular weight (Mw) of the resin of component (B) is preferably in a range of from 1,000 to 15,000, and more preferably in a range of from 3,000 to 10,000. The molecular weight distribution (Mw/Mn) is preferably from 1.0 to 2.0, more preferably from 1.0 to 1.8, and particularly preferably from 1.0 to 1.5.

Here, the weight average molecular weight is defined as the polystyrene equivalent by gel permeation chromatography.

The resin of component (B) may be used in combination of two or more kinds.

The addition amount of the resin of component (B) is generally from 10 to 99 mass % in total based on the total solids content of the positive resist composition, preferably from 15 to 97 mass %, and especially preferably from 20 to 95 mass %.

The specific examples of the resins of component (B) are shown below, but the invention is not restricted thereto.

(1)

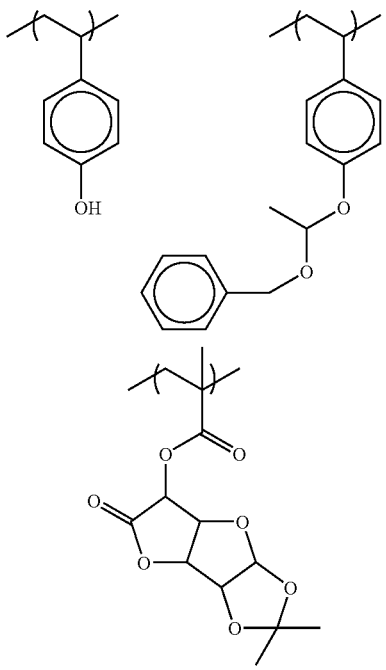

(2)

(3)

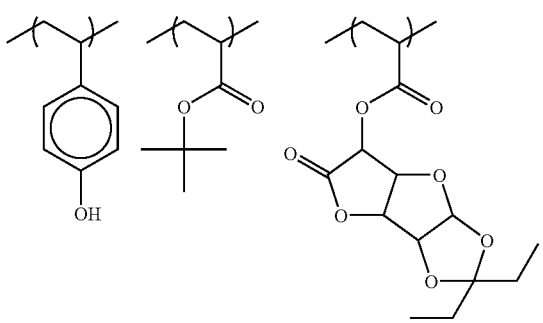

(4)

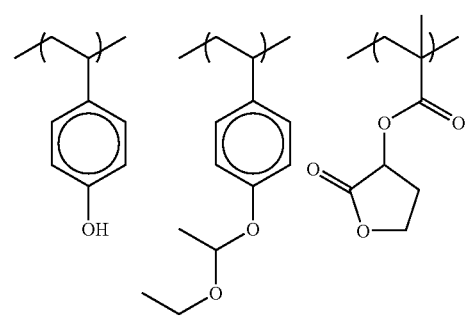

(5)

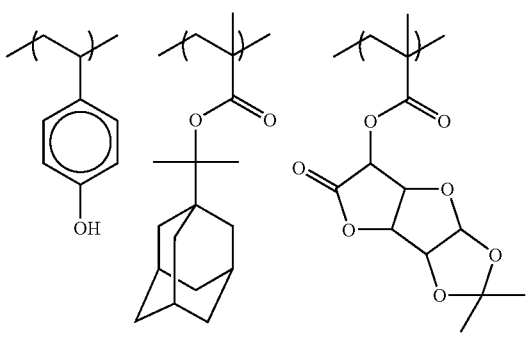

(6)

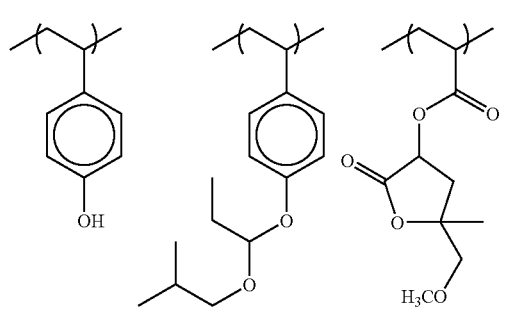

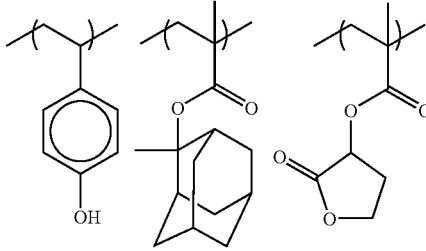

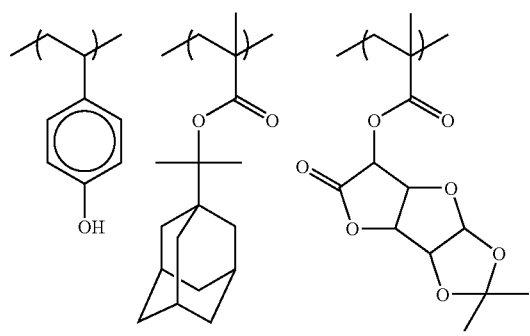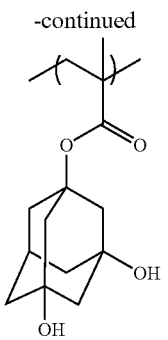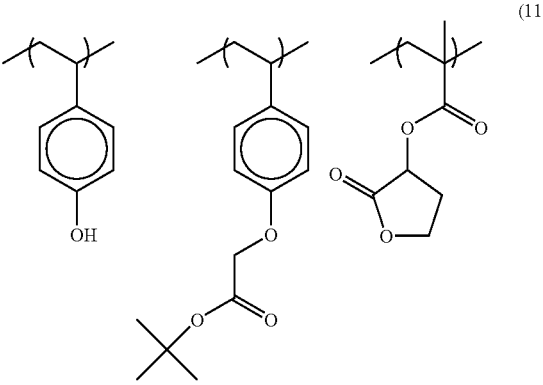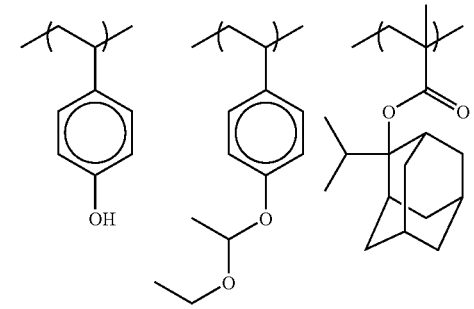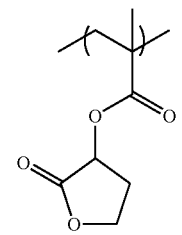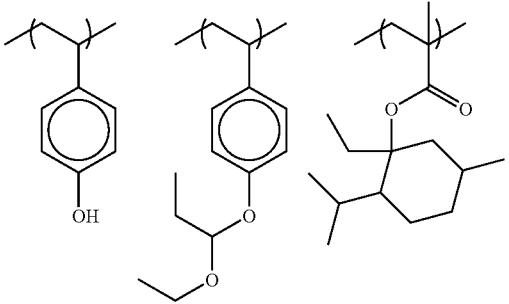

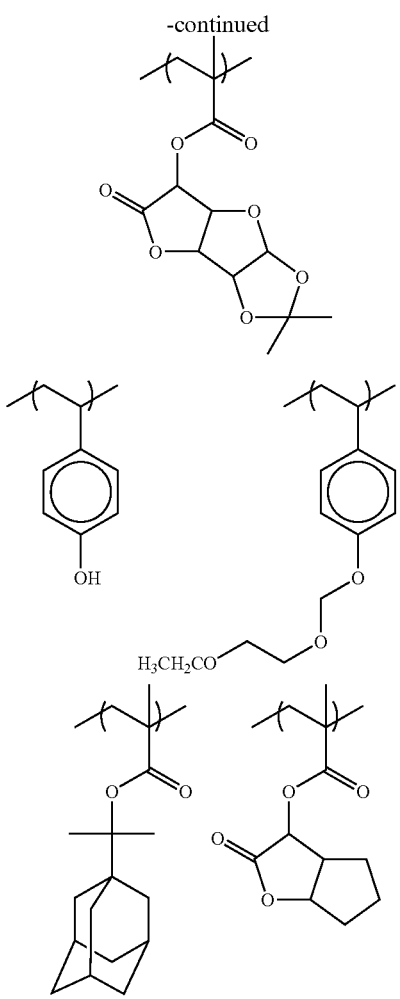

(14)

[2] Compounds (A) Capable of Generating Sulfonic Acid, bis(alkylsulfonyl)amide, or tris(alkylsulfonyl)methine upon Irradiation with Actinic Ray or Radiation:

A compound capable of generating sulfonic acid, bis(alkylsulfonyl)amide, or tris(alkylsulfonyl)methine upon irradiation with actinic ray or radiation that is contained in the positive resist composition of the invention (also referred to as "compound (A)" or "a sulfonic acid generator") is a compound capable of generating sulfonic acid, bis(alkylsulfonyl)amide, or tris(alkylsulfonyl)methine upon irradiation with actinic ray or radiation such as KrF excimer laser rays, electron beams, EUV rays, etc., and, for example, a diazonium salt, a phosphonium salt, a sulfonium salt, an iodonium salt, imidosulfonate, oximesulfonate, diazodi-sulfone, disulfone, o-nitrobenzylsulfonate, etc., can be exemplified.

Further, compounds obtained by introducing a group or a compound capable of generating an acid upon irradiation with actinic ray or radiation to the main chain or side chain of a polymer, e.g., the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

The compounds capable of generating an acid by light as disclosed in U.S. Pat. No. 3,779,778 and EP-126712 can also be used.

In the invention, as sulfonic acid generators that are preferred from the viewpoint of the improvement of image properties, such as resolution and a pattern configuration, a sulfonium salt, an iodonium salt, imidosulfonate, oximesulfonate, diazodisulfone, and disulfone can be exemplified.

Of the sulfonic acid generators, the compounds represented by the following formula (ZI), (ZII) or (ZIII) can be exemplified as preferred compounds.

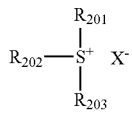

ZI

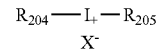

ZII

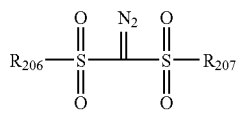

ZIII

In formula (ZI), $R_{201}$, $R_{202}$ and $R_{203}$ each represents an organic group; and $X^-$ represents a sulfonate anion, a bis(alkylsulfony)amide anion, or a tris(alkylsulfonyl)methide anion.

As preferred sulfonate anion, bis(alkylsulfony)amide anion, and tris(alkylsulfonyl)methide anion, anions represented by the following formulae can be exemplified.

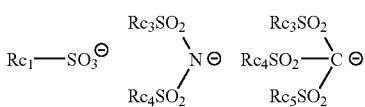

In the above formulae, $Rc_1$ represents an organic group. As the organic group represented by $Rc_1$, an organic group having from 1 to 30 carbon atoms is exemplified, and preferably an alkyl group, cycloalkyl group, aryl group, each of which may be substituted, and groups obtained by linking two or more of these groups with a linking group, e.g., —O—, —$CO_2$—, —S—, —$SO_3$—, —$SO_2N(Rd_1)$-, etc., can be exemplified.

$Rd_1$ represents a hydrogen atom or an alkyl group.

$Rc_3$, $Rc_4$ and $Rc_5$ each represents an organic group.

As the organic groups represented by $Rc_3$, $Rc_4$ and $Rc_5$, the organic groups enumerated as preferred organic groups in $Rc_1$ can be exemplified, preferably a perfluoroalkyl group having from 1 to 4 carbon atoms.

$Rc_3$ and $Rc_4$ may be bonded to each other to form a ring.

As the groups formed by $Rc_3$ and $Rc_4$ by bonding, an alkylene group, a cycloalkylene group, and an arylene group can be exemplified, preferably a perfluoroalkylene group having from 2 to 4 carbon atoms.

As the organic groups represented by $Rc_1$, $Rc_3$ to $Rc_5$, preferably an alkyl group substituted with a fluorine atom or a fluoroalkyl group at the 1-position, and a phenyl group substituted with a fluorine atom or a fluoroalkyl group can be exemplified. By the presence of a fluorine atom or a fluoroalkyl group, the acidity of the acid generated with light irradiation increases to improve sensitivity. Further, by the formation of a ring by bonding of $Rc_3$ and $Rc_4$, the acidity of the acid generated with light irradiation preferably increases to improve sensitivity.

In formula (ZI), the number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

A compound represented by formula (ZI) may be a compound having a plurality of structures represented by formula (ZI). For instance, a compound represented by formula (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as preferred compounds represented by formula (ZI).

Compound (ZI-1) is an arylsulfonium compound in which at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkylsulfonium compound, a diarylcycloalkylsulfonium compound, and an aryldicycloalkylsulfonium compound can be exemplified.

As the aryl group of the arylsulfonium compound, an aryl group, e.g., a phenyl group and a naphthyl group, and a heteroaryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group that the arylsulfonium compound has according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the more preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below.

Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably represents a straight chain, branched or cyclic 2-oxoalkyl group, or an alkoxycarbonylmethyl group, and still more preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group; a butyl group, and a pentyl group can be exemplified. The alkyl group represented by $R_{201}$, $R_{202}$ and $R_{203}$ is more preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. The cycloalkyl group represented by $R_{201}$, $R_{202}$ and $R_{203}$ is more preferably a cyclic 2-oxoalkyl group.

As the straight chain, branched or cyclic 2-oxoalkyl group represented by $R_{201}$, $R_{202}$ and $R_{203}$, preferably a group having >C=O at the 2-position of the above alkyl group and the cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms (e.g., a methoxy group, an ethoxy group, a propoxy group, a butoxy group, and a pentoxy group) can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

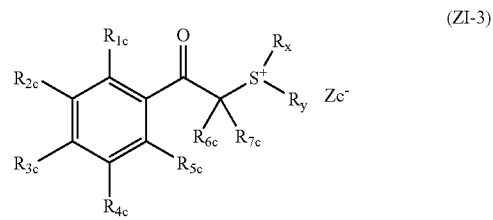

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxy group, or a halogen atom.

$R_{6c}$ and $R_{7c}$ each represents a hydrogen atom, an alkyl group or a cycloalkyl group.

$R_x$ and $R_y$ each represents an alkyl group, a cycloalkyl group, an allyl group, or a vinyl group.

Any two or more of $R_{1c}$ to $R_{5c}$, $R_{6c}$ and $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{5c}$, $R_{6c}$ and $R_{7c}$, and $R_x$ and $R_y$, a butylene group, a pentylene group, etc., can be exemplified.

$Z_c^-$ represents a sulfonate anion, a bis(alkylsulfony)-amide anion, or a tris(alkylsulfonyl)methide anion, and has the same meaning as $X^-$ in formula (ZI).

The alkyl group represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms, e.g., a methoxy group, an ethoxy group, a straight chain or branched propoxy group, a straight chain or branched butoxy group, and a straight chain or branched pentoxy group, a cyclic alkoxyl group having from 3 to 8 carbon atoms, e.g., a cyclopentyloxy group, and a cyclohexyloxy group can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15. By selecting such substituents, the solubility in a solvent is improved and the generation of particles during preservation can be restrained.

As the alkyls group represented by $R_x$ and $R_y$, the same alkyl group as represented by $R_{1c}$ to $R_{7c}$ can be exemplified. The alkyl group represented by $R_x$ and $R_y$ is more preferably a straight chain or branched 2-oxoalkyl group or an alkoxycarbonylmethyl group.

As the cycloalkyl group represented by $R_x$ and $R_y$, the same cycloalkyl group as represented by $R_{1c}$ to $R_{7c}$ can be exemplified. The cycloalkyl group represented by $R_x$ and $R_y$ is more preferably a cyclic 2-oxoalkyl group.

As the straight chain, branched, or cyclic 2-oxoalkyl group, the group having $>C=O$ on the 2-position of the alkyl group or the cycloalkyl group represented by $R_1$ to $R_{7c}$ can be exemplified.

As the alkoxyl group in the alkoxycarbonylmethyl group, the same alkoxyl group as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each represents an aryl group, an alkyl group or a cycloalkyl group.

The aryl group represented by $R_{204}$ to $R_{207}$ is preferably an aryl group, e.g., a phenyl group or a naphthyl group, or a heteroaryl group, e.g., an indole residue or a pyrrole residue, and more preferably a phenyl group or an indole residue.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbonyl group can be exemplified.

As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a sulfonate anion, a bis(alkylsulfony)-amide anion, or a tris(alkylsulfonyl)methide anion, and has the same meaning as $X^-$ in formula (ZI).

As preferred compounds of the sulfonic acid generators, compounds represented by the following formula (ZIV), (ZV) or (ZVI) can further be exemplified.

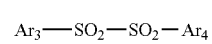

ZIV

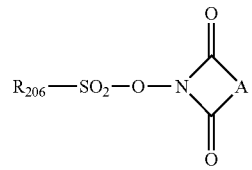

ZV

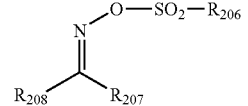

ZVI

In formulae (ZIV) to (ZVI), $Ar_3$ and $Ar_4$ each represents an aryl group.

$R_{206}$ represents an alkyl group, a cycloalkyl group, or an aryl group.

$R_{207}$ and $R_{208}$ each represents an alkyl group, a cycloalkyl group, an aryl group, or an electron attractive group. $R_{207}$ preferably represents an aryl group. $R_{208}$ preferably represents an electron attractive group, and more preferably a cyano group or a fluoroalkyl group.

A represents an alkylene group, an alkenylene group, or an arylene group.

Of the sulfonic acid generators, the examples of particularly preferred compounds are shown below.

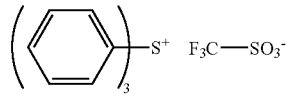

B-1

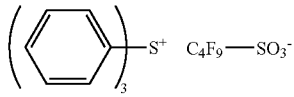

B-2

-continued
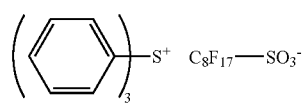
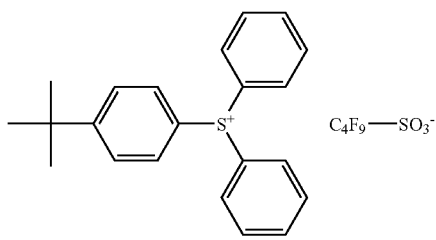
B-3
B-4
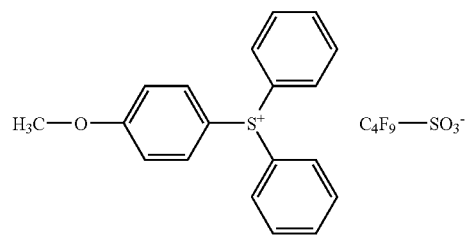
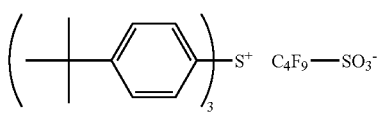
B-5
B-6
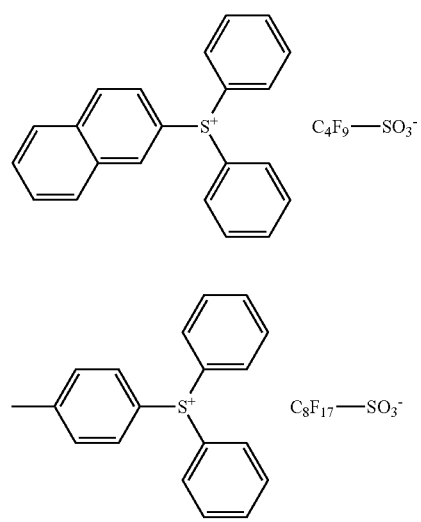
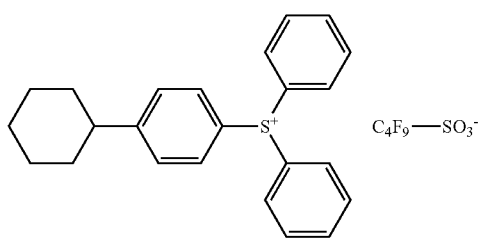
B-7
B-8
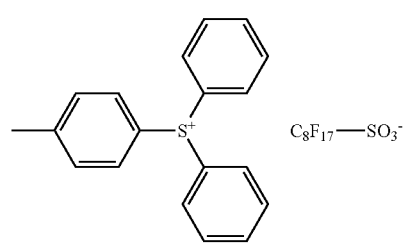
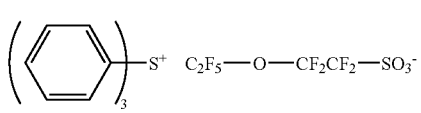
B-9
B-10
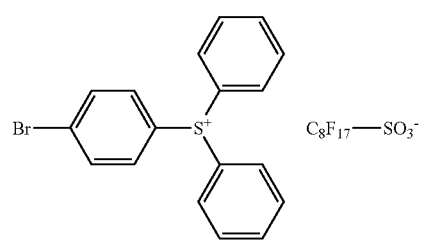
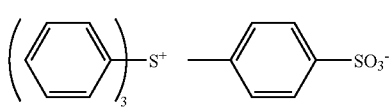
B-11
B-12
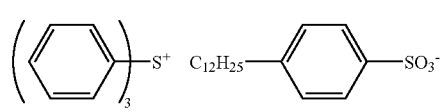
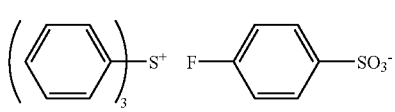
B-13
B-14
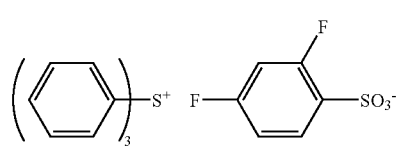
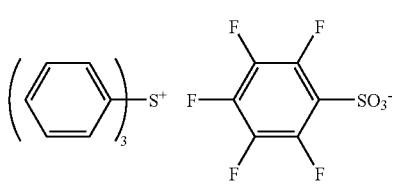
B-15
B-16

-continued
B-17
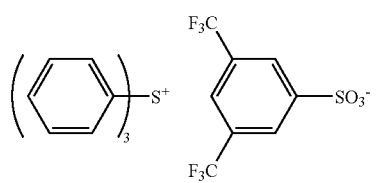
B-18
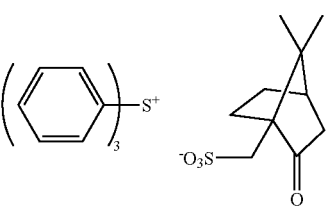
B-19
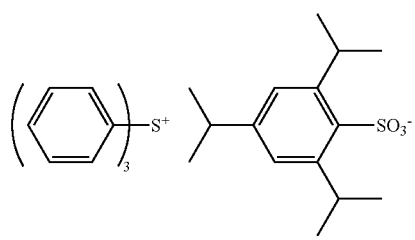
B-20
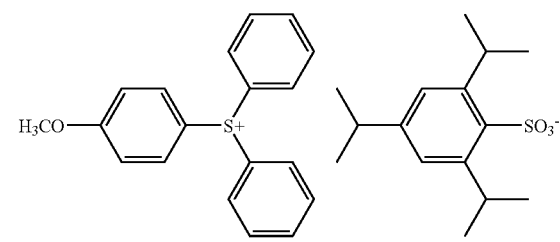
B-21
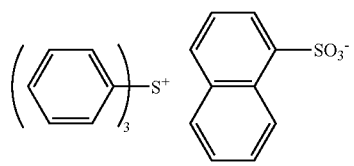
B-22
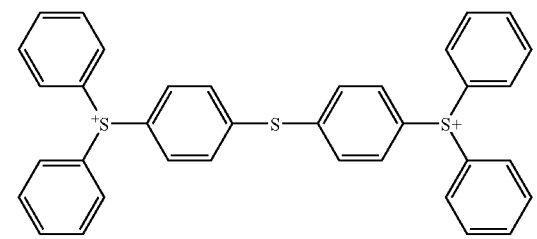
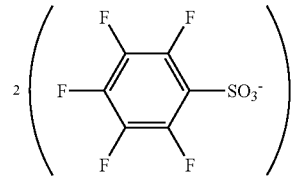
B-23
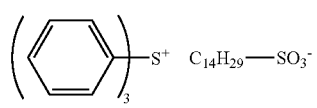
B-24
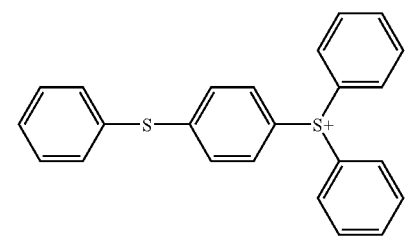
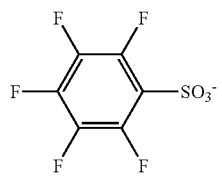
B-25
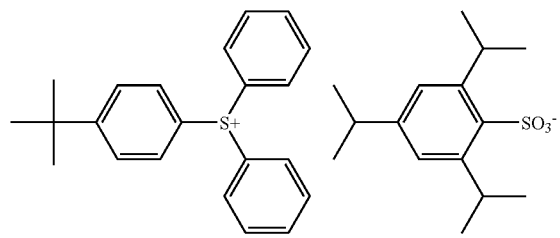
B-26
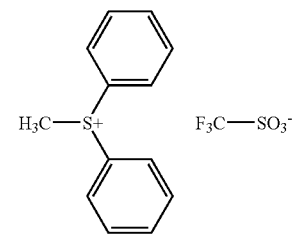

-continued
B-27 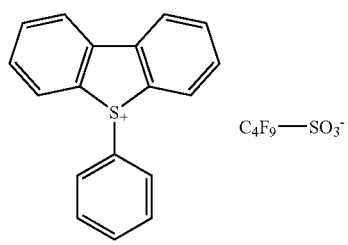
B-28 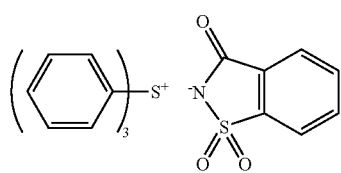
B-29 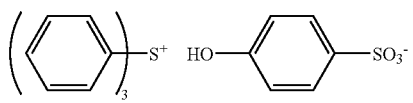
B-30 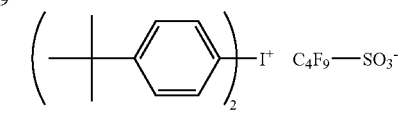
B-31 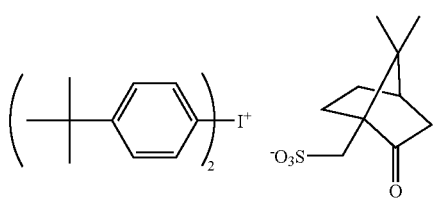
B-32 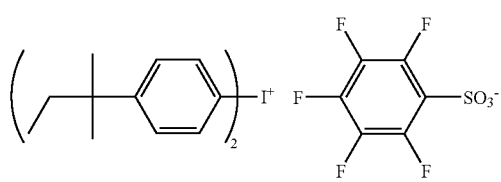
B-33 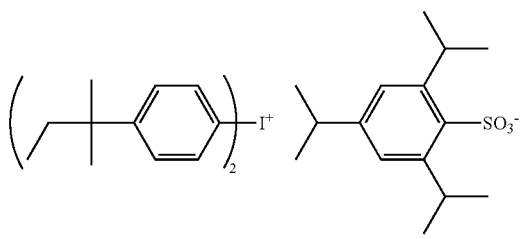
B-34 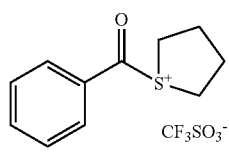
B-35 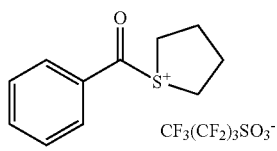
B-36 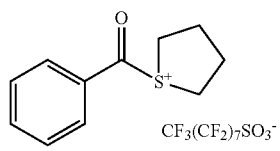
B-37 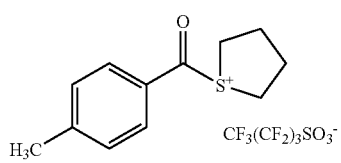
B-38 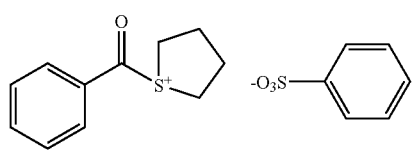
B-39 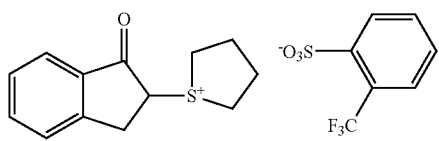
B-40 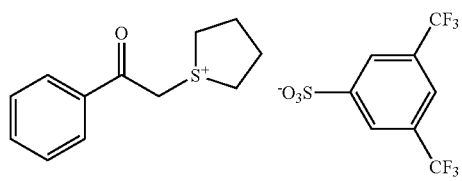
B-41 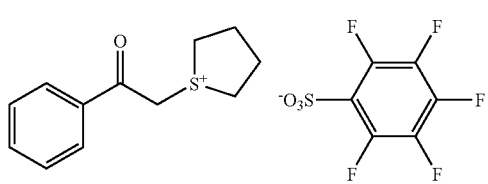
B-42 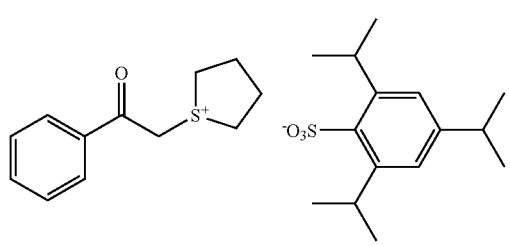

-continued
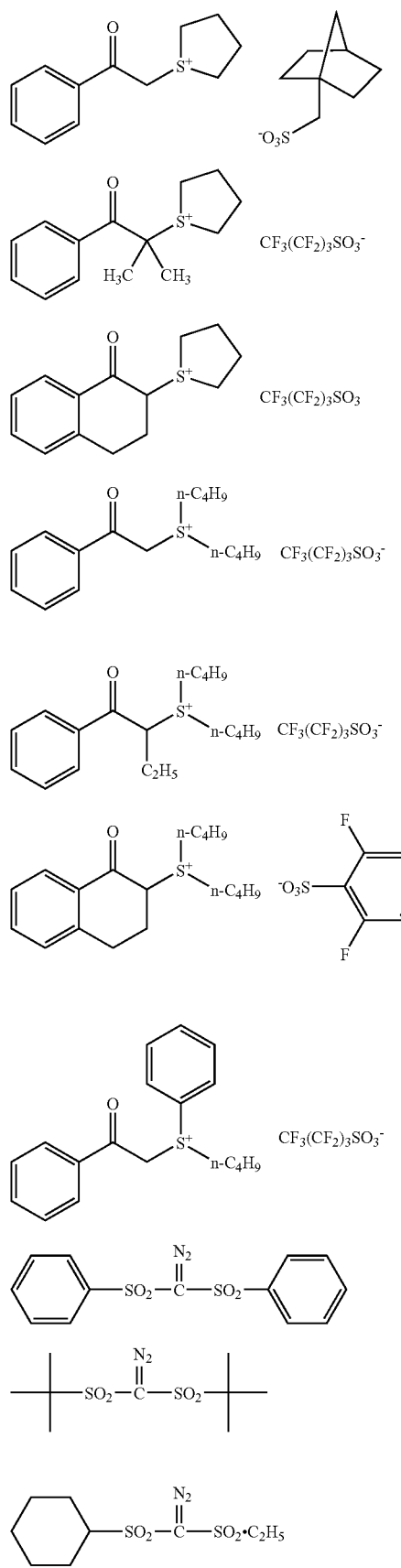
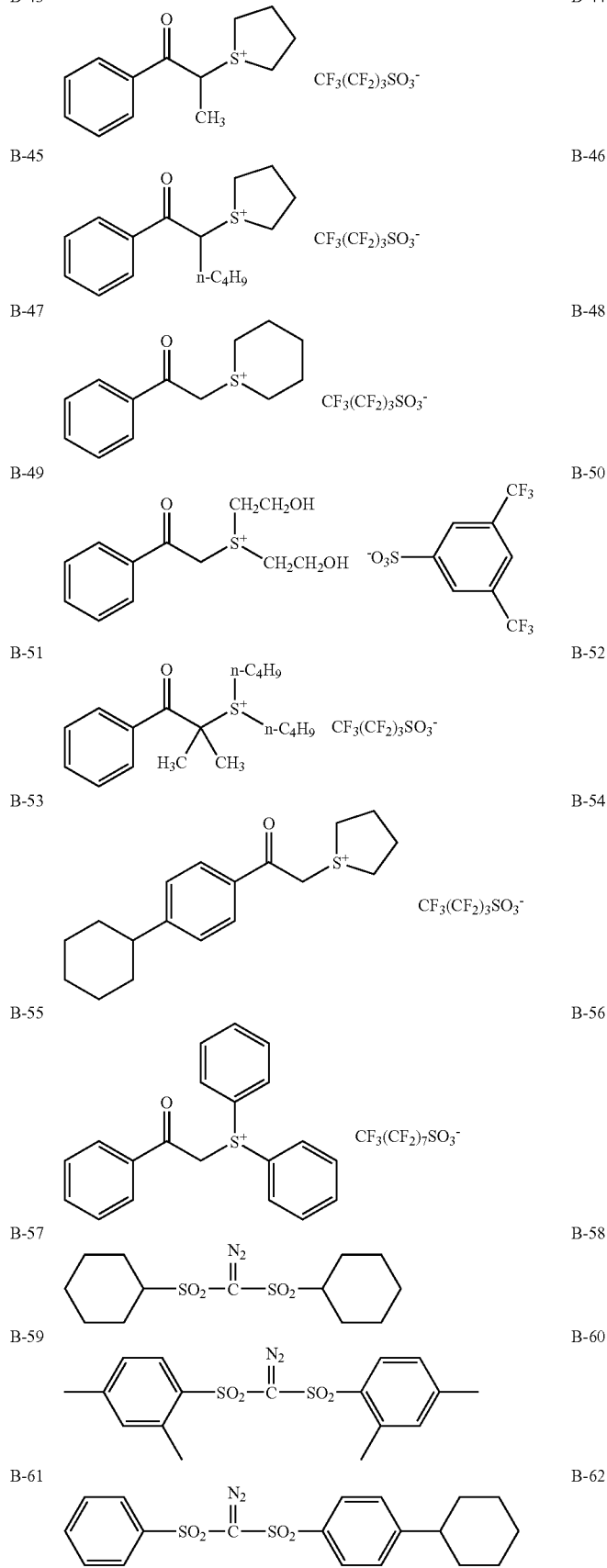

-continued
B-63
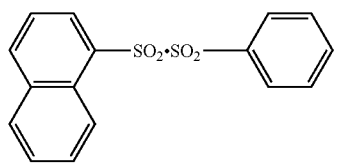
B-64
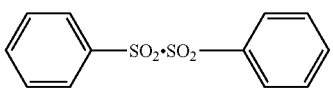
B-65
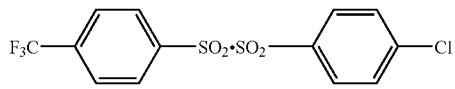
B-66
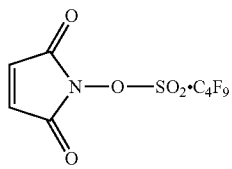
B-67
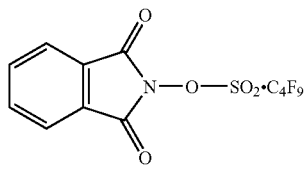
B-68
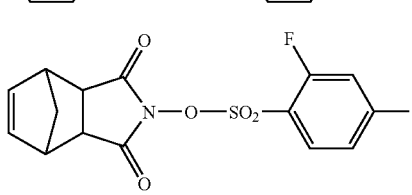
B-69
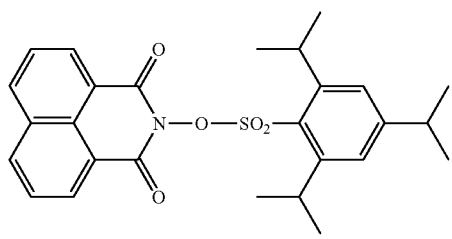
B-70
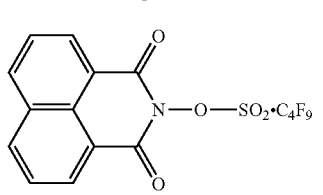
B-71
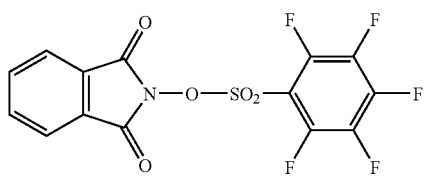
B-72
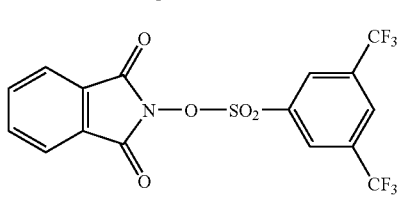
B-73
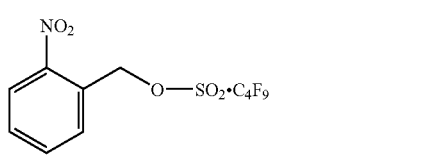
B-74
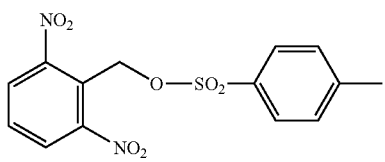
B-75
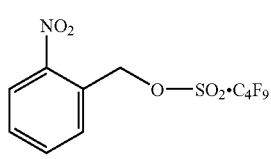
B-76
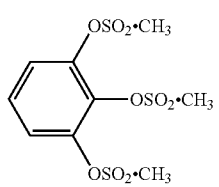
B-77
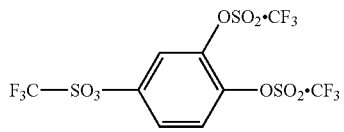
B-78
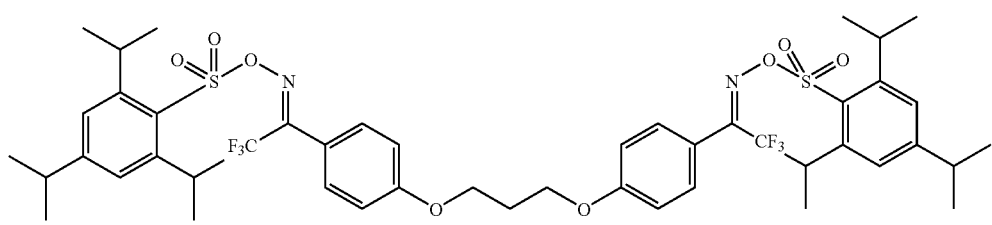

B-79
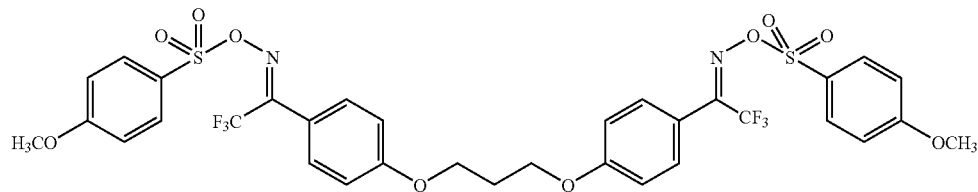
B-80
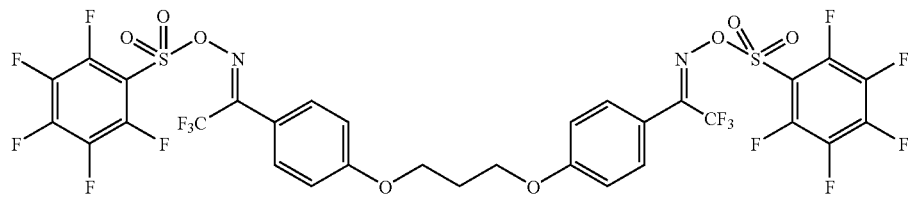
B-81
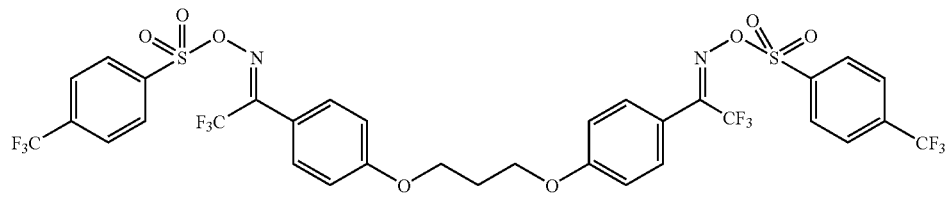
B-82 B-83
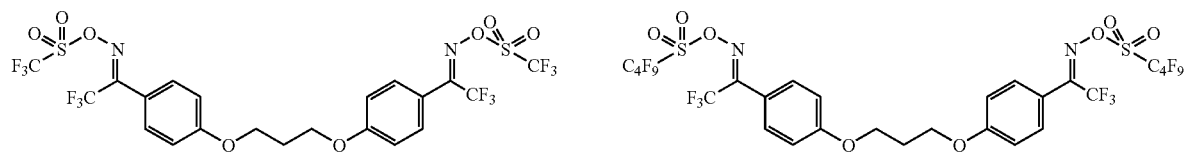
B-84 B-85
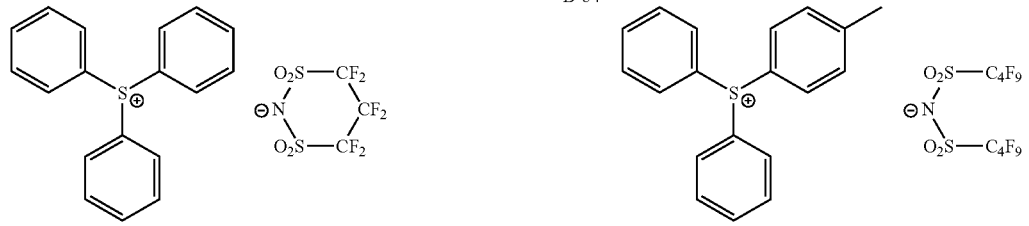
B-86 B-87
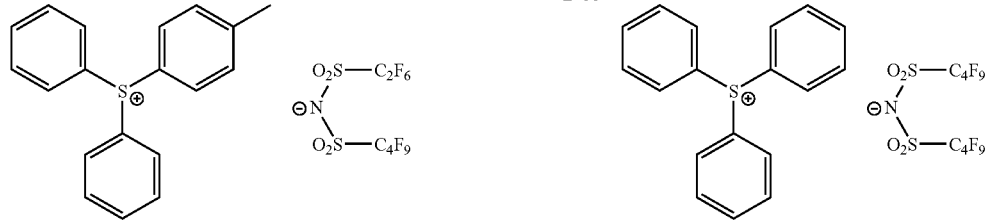
B-88 B-89
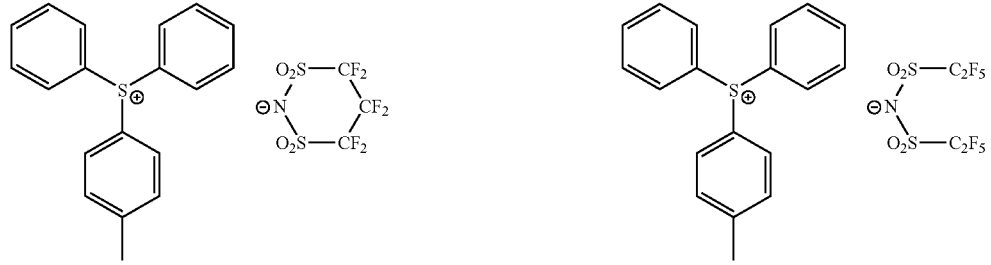

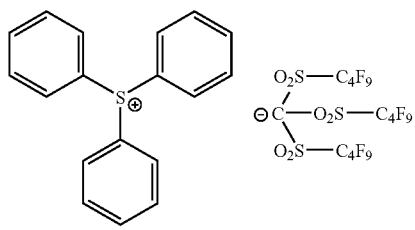

B-90

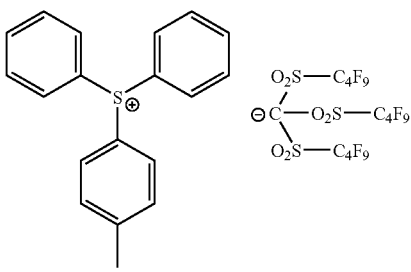

B-91

The content of compound (A) is from 5 to 20 mass % based on the solids content of the resist composition, preferably from 6 to 18 mass %, and especially preferably from 7 to 16 mass %. The content is 5 mass % or more from the point of sensitivity and line edge roughness, and 20 mass % or less from the point of resolution, pattern configuration and film property. Compound (A) may be used alone, or two or more kinds may be used as mixture. For example, as compound (A), a compound capable of generating arylsulfonic acid upon irradiation with actinic ray or radiation, and a compound capable of generating alkylsulfonic acid upon irradiation with actinic ray or radiation may be used in combination.

Compound (A) can be synthesized according to well-known methods, such as the synthesizing method disclosed in JP-2002-27806.

[3] Compounds (C) Capable of Generating Carboxylic Acid upon Irradiation with Actinic Ray or Radiation:

Together with a sulfonic acid generator (compound (A)), a positive resist composition of the invention can contain a compound capable of generating a carboxylic acid upon irradiation with actinic ray or radiation (also referred to as "compound (C)" or "a carboxylic acid generator").

As the carboxylic acid generator, a compound represented by the following formula (C1) is preferably used.

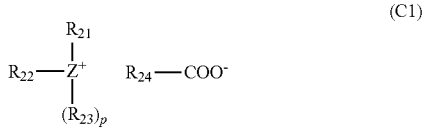

(C1)

In formula (C1), $R_{21}$, $R_{22}$ and $R_{23}$ each represents an alkyl group, a cycloalkyl group, an alkenyl group, or an aryl group; $R_{24}$ represents a hydrogen atom, an alkyl group, a cycloalkyl group, an alkenyl group, or an aryl group; and Z represents a sulfur atom or an iodine atom. When Z represents a sulfur atom, p is 1, and when an iodine atom, p is 0.

In formula (C1), $R_{21}$, $R_{22}$ and $R_{23}$ each represents an alkyl group, a cycloalkyl group, an alkenyl group, or an aryl group, and these groups may have a substituent.

As the examples of the substituents that the alkyl group, the cycloalkyl group, and the alkenyl group may have, e.g., a halogen atom (a chlorine atom; a bromine atom, a fluorine atom, etc.), an aryl group (a phenyl group, a naphthyl group, etc.), a hydroxyl group, and an alkoxyl group (a methoxy group, an ethoxy group, a butoxy group, etc.) can be exemplified.

As the examples of the substituents that the aryl group may have, e.g., a halogen atom (a chlorine atom, a bromine atom, a fluorine atom, etc.), a nitro group, a cyano group, an alkyl group (a methyl group, an ethyl group, a t-butyl group, a t-amyl group, an octyl group, etc.), a hydroxyl group, and an alkoxyl group (a methoxy group, an ethoxy group, a butoxy group, etc.) can be exemplified.

$R_{21}$, $R_{22}$ and $R_{23}$ each preferably represents an alkyl group having from 1 to 12 carbon atoms, a cycloalkyl group having from 3 to 12 carbon atoms, an alkenyl group having from 2 to 12 carbon atoms, or an aryl group having from 6 to 24 carbon atoms, more preferably an alkyl group having from 1 to 6 carbon atoms, a cycloalkyl group having from 3 to 6 carbon atoms, or an aryl group having from 6 to 18 carbon atoms, and especially preferably an aryl group having from 6 to 15 carbon atoms. These groups may each have a substituent.

$R_{24}$ represents a hydrogen atom, an alkyl group, a cycloalkyl group, an alkenyl group, or an aryl group.

As the examples of the substituents that the alkyl group, the cycloalkyl group, and the alkenyl group may have, the same groups as enumerated above as the examples of the substituents in the case where $R_{21}$ represents an alkyl group can be exemplified. As the examples of the substituents of the aryl group, the same groups as enumerated above as the examples of the substituents in the case where $R_{21}$ represents an aryl group can be exemplified.

$R_{24}$ preferably represents a hydrogen atom, an alkyl group having from 1 to 30 carbon atoms, a cycloalkyl group having from 3 to 30 carbon atoms, an alkenyl group having from 2 to 30 carbon atoms, or an aryl group having from 6 to 24 carbon atoms, more preferably an alkyl group having from 1 to 18 carbon atoms, a cycloalkyl group having from 3 to 18 carbon atoms, or an aryl group having from 6 to 18 carbon atoms, and especially preferably an alkyl group having from 1 to 12 carbon atoms, a cycloalkyl group having from 3 to 12 carbon atoms, or an aryl group having from 6 to 15 carbon atoms. These groups may each have a substituent.

Z represents a sulfur atom or an iodine atom. When Z represents a sulfur atom, p is 1, and when an iodine atom, p is 0.

Incidentally, two or more of cationic parts represented by formula (C1) may be bonded via a single bond or a linking group (e.g., —S—, —O—, or the like) to form a cationic structure having a plurality of cationic parts of formula (C1).

The preferred specific examples of the compounds (C) capable of generating a carboxylic acid upon irradiation with actinic ray or radiation are shown below, but the invention is by no means restricted thereto.

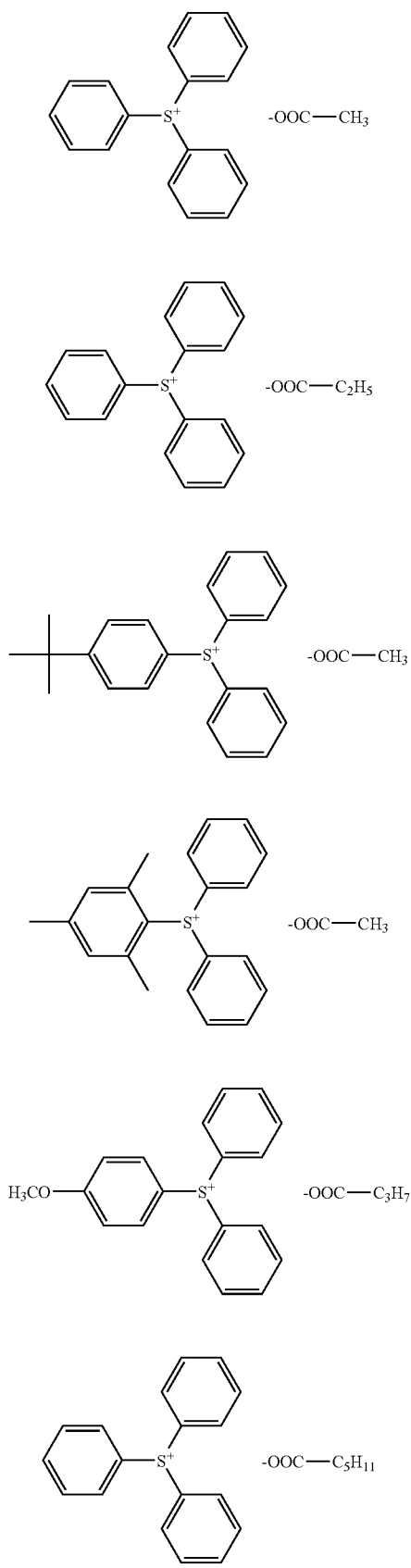
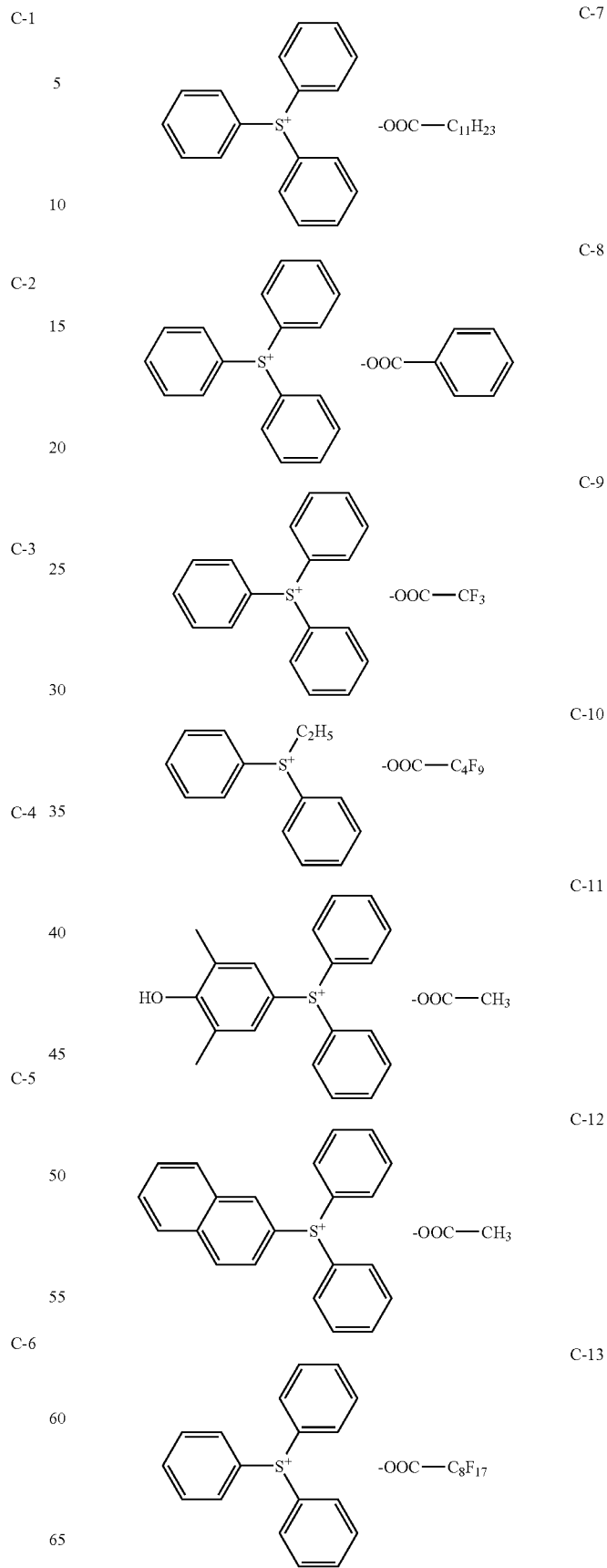

C-14 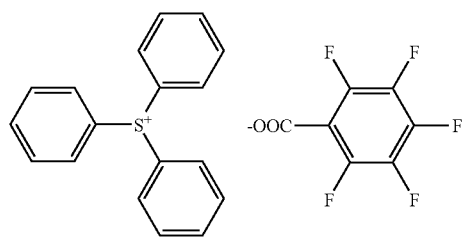

C-15 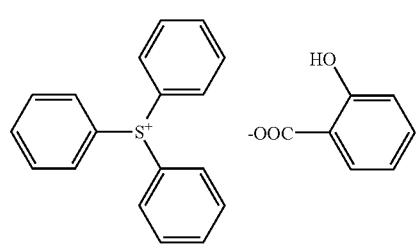

C-16 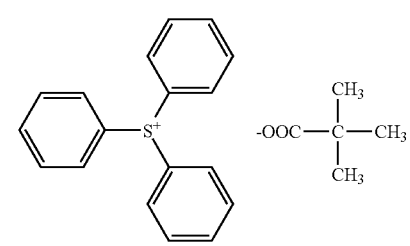

C-17 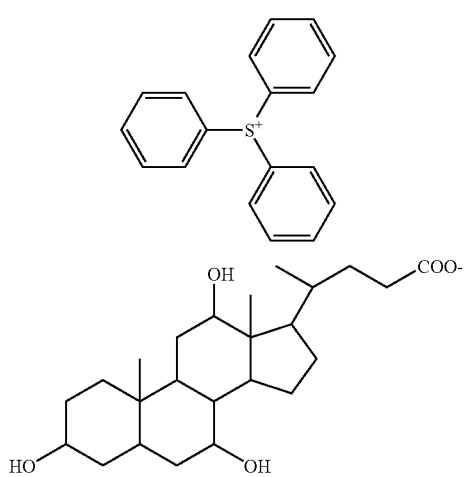

C-18 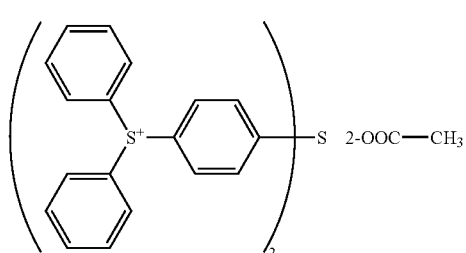

C-19 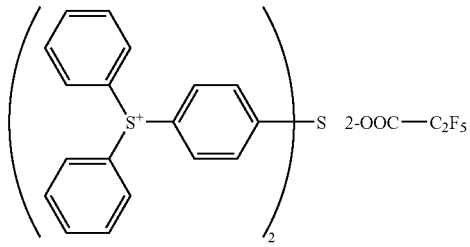

C-20 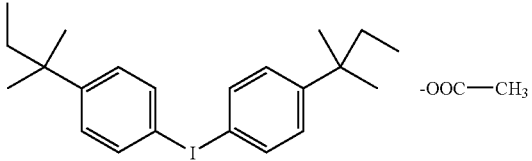

C-21 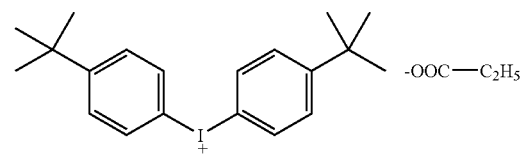

C-22 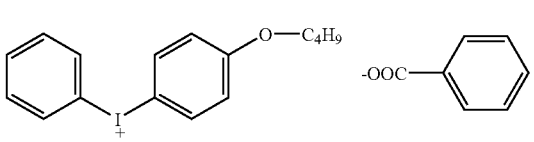

C-23 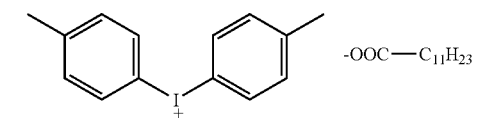

C-24 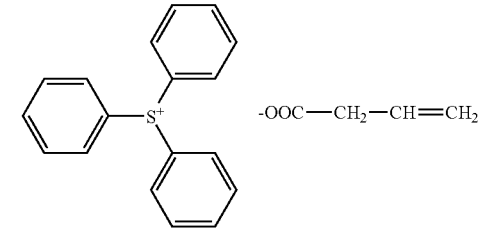

C-25 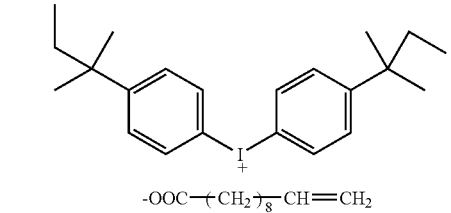

The content of compound (C) in a positive resist composition of the invention is preferably from 0.01 to 10 mass % based on all the solids content of the composition, more preferably from 0.03 to 5 mass %, and especially preferably from 0.05 to 3 mass %. Compound (C) capable of generating carboxylic acid upon irradiation with actinic ray or radiation may be used alone, or two or more compounds may be used as mixture.

The mass ratio of compound (C)/compound (A) is generally from 99.9/0.1 to 50/50, preferably from 99/1 to 60/40, and especially preferably from 98/2 to 70/30.

Compound (C) can be synthesized according to well-known methods, such as the synthesizing method disclosed in JP-2002-27806.

[4] Organic Basic Compounds:

It is preferred in the invention to use an organic basic compound from the point of view of the improvement of performances such as resolution and preservation stability. As organic basic compounds, compounds containing nitrogen (a nitrogen-containing basic compound) are more preferred.

Preferred organic basic compounds in the invention are compounds stronger in basicity than phenol.

As preferred chemical environment, the following structures (A) to (E) can be exemplified. Formulae (B) to (E) may be a part of a cyclic structure.

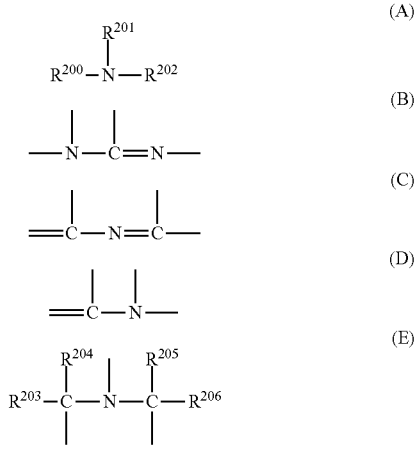

In formula (A), $R^{200}$, $R^{201}$ and $R^{202}$, which may be the same or different, each represents a hydrogen atom, an alkyl group having from 1 to 20 carbon atoms, a cycloalkyl group having from 1 to 20 carbon atoms, or an aryl group having from 6 to 20 carbon atoms, and $R^{201}$ and $R^{202}$ may be bonded to each other to form a ring.

The alkyl group, cycloalkyl group and aryl group represented by $R^{200}$, $R^{201}$ and $R^{202}$ may each have a substituent. As the alkyl group and cycloalkyl group having a substituent, an aminoalkyl group and an aminocycloalkyl group having from 1 to 20 carbon atoms, and a hydroxyalkyl group having from 1 to 20 carbon atoms are preferred.

In formula (E), $R^{203}$, $R^{204}$, $R^{205}$ and $R^{206}$, which may be the same or different, each represents an alkyl group having from 1 to 6 carbon atoms, or a cycloalkyl group having from 1 to 6 carbon atoms.

More preferred organic basic compounds are nitrogen-containing basic compounds having two or more nitrogen atoms of different chemical environments in one molecule, and especially preferred compounds are compounds containing both of a substituted or unsubstituted amino group and a cyclic structure containing a nitrogen atom, or compounds having an alkylamino group.

As preferred specific examples of nitrogen-containing basic compounds, guanidine, aminopyridine, aminoalkyl-pyridine, aminopyrrolidine, indazole, imidazole, pyrazole, pyrazine, pyrimidine, purine, imidazoline, pyrazoline, piperazine, aminomorpholine, aminoalkylmorpholine, etc., are exemplified. As preferred substituents that these compounds may have, an amino group, an alkylamino group, aminoaryl group, arylamino group, an alkyl group (as a substituted alkyl group, especially an aminoalkyl group), an alkoxyl group, an acyl group, an acyloxy group, an aryl group, an aryloxy group, a nitro group, a hydroxyl group, a cyano group, etc., are exemplified.

As especially preferred compounds, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, etc., are exemplified, but the invention is not restricted thereto.

These nitrogen-containing basic compounds are used alone, or two or more in combination.

Tetraalkylammonium salt type nitrogen-containing basic compounds can also be used. As such compounds, tetraalkylammonium hydroxide (e.g., tetramethylammonium hydroxide, tetraethylammonium hydroxide, tetra(n-butyl)ammonium hydroxide, etc.) having from 1 to 8 carbon atoms are especially preferred. These nitrogen-containing basic compounds can be used alone, or two or more compounds can be used in combination.

The use proportion of an acid generator and an organic basic compound in a composition is preferably (total amount of acid generators)/(an organic basic compound) of from 2.5 to 300 in a molar ratio. By making the molar ratio 2.5 or more, sensitivity can be increased, and by making 300 or less, thickening of a resist pattern by aging after exposure until heating treatment can be restrained and resolution can be improved. (Total amount of acid generators)/(an organic basic compound) (molar ratio) is more preferably from 5.0 to 200, and still more preferably from 7.0 to 150.

[5] Surfactants:

Surfactants can be used in the invention. To use surfactants is preferred from the point of view of film forming property, adhesion property of a pattern, and the decrease in development defects.

The specific examples of surfactants include nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylallyl ether, e.g., polyoxyethylene octylphenol ether, polyoxyethylene nonylphenol ether, etc., polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine surfactants and silicon surfactants such as Eftop EF301, EF303, and EF352 (manufactured by Shin-Akita Kasei Co., Ltd.), Megafac F171 and F173 (manufactured by Dainippon Ink and Chemicals Inc.), Fluorad FC430 and FC431 (manufactured by Sumitomo 3M Limited), Asahi Guard AG710, Sarfron S-382, SC101, SC102, SC103, SC104, SC105, and SC106 (manufactured by ASAHI GLASS CO., LTD.), and Troy Sol S-366 (manufactured by Troy Chemical Co., Ltd.); and organosiloxane polymer KP341 (manufactured by Shin-Etsu Chemical Co., Ltd.), and acrylic or methacrylic (co)polymer POLYFLOW No. 75 and No. 95 (manufactured by Kyoei Chemical Co., Ltd.). The blending amount of these surfactants is generally 2 mass parts or lower per 100 mass parts of the solids content of the composition in the invention, and preferably 1 mass part or lower.

These surfactants may be used alone, or a plurality of surfactants may be used in combination.

Incidentally, it is preferred to use either one or two or more of fluorine and/or silicon surfactant (a fluorine surfactant, a silicon surfactant, a surfactant containing both a fluorine atom and a silicon atom).

As these surfactants, the surfactants disclosed, e.g., in the specifications of the following patents can be used: JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. Commercially available surfactants shown below can also be used as they are.

As commercially available surfactants usable in the invention, fluorine or silicon surfactants such as Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well-known surfactants, surfactants using polymers having a fluoro-aliphatic group derived from a fluoro-aliphatic compound manufactured by a telomerization method (also called a telomer method) or an oligomerization method (also called an oligomer method) can be used. A fluoro-aliphatic compound can be synthesized according to the method disclosed in JP-A-2002-90991.

As polymers having a fluoro-aliphatic group, copolymers of monomers having a fluoro-aliphatic group and (poly(oxyalkylene)) acrylate and/or (poly(oxyalkylene)) methacrylate are preferred, and these copolymers may be irregularly distributed or may be block copolymerized. As the poly-(oxyalkylene) groups, a poly(oxyethylene) group, a poly-(oxypropylene) group, and a poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene) acrylate (or methacrylate) may be not only bipolymers but also terpolymers or higher polymers obtained by copolymerization of monomers having different two or more kinds of fluoro-aliphatic groups, or different two or more kinds of poly(oxyalkylene) acrylates (or methacrylates) at the same time.

For example, as commercially available surfactants, Megafac F178, F-470, F-473, F-475, F-476 and F-472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly(oxypropylene)) acrylate (or methacrylate), copolymers of acrylate (or methacrylate) having a $C_8F_{17}$ group and (poly(oxyethylene)) acrylate (or methacrylate), copolymers of acrylate (or methacrylate) having a $C_8F_{17}$ group, (poly(oxy-ethylene)) acrylate (or methacrylate), and poly(oxypropylene) acrylate (or methacrylate), etc., are exemplified.

The use amount of surfactants is preferably from 0.0001 to 2 mass % to the total amount of the positive resist composition (excluding solvents), more preferably from 0.001 to 1 mass %.

[6] Other Components:

A positive resist composition in the invention can further contain a dye and a photo-base generator, if necessary.

1. Dyes:

A dye can be used in the invention.

As preferred dyes, oil dyes and basic dyes are exemplified. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Chemical Industries, Ltd.), Crystal Violet (C.I. 42555), Methyl Violet (C.I. 42535), Rhodamine B (C.I. 45170B), Malachite Green (C.I. 42000), Methylene Blue (C.I. 52015), etc., can be exemplified.

2. Photo-base Generators:

As photo-base generators that can be added to a composition of the invention, the compounds disclosed in JP-A-4-151156, JP-A-4-162040, JP-A-5-197148, JP-A-5-5995, JP-A-6-194834, JP-A-8-146608, JP-A-10-83079, and EP 622682 can be exemplified. Specifically, 2-nitrobenzyl carbamate, 2,5-dinitrobenzyl cyclohexylcarbamate, N-cyclohexyl-4-methylphenylsulfonamide, 1,1-dimethyl-2-phenylethyl-N-isopropyl carbamate, etc., can be preferably used. These photo-base generators are added for the purpose of the improvement of resist configuration and the like.

3. Solvents:

The above components of the resist composition in the invention are dissolved in a solvent and coated on a support. The concentration of the solids content of all the resist composition is generally preferably from 2 to 30 mass %, and more preferably from 3 to 25 mass %.

As the solvents used here, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, tetrahydrofuran, etc., are preferred, and these solvents are used alone or as mixture.

The positive resist composition in the invention is coated on a substrate to form a thin film. The thickness of the coated film is preferably from 0.05 to 4.0 μm.

In the invention, if necessary, commercially available inorganic or organic antireflection films can be used. It is also possible to coat an antireflection film as the lower layer of the resist.

As antireflection films used as the lower layer of the resist, both of an inorganic film type; e.g., titanium, titanium dioxide, titanium nitride, chromium oxide, carbon, amorphous silicon, etc., and an organic film type, e.g., films comprising light absorbers and polymer materials can be used. The former necessitates equipments such as a vacuum evaporation apparatus, a CVD apparatus, or a sputtering apparatus in film forming. As organic antireflection films, e.g., those comprising condensation products of diphenylamine derivatives and formaldehyde-modified melamine resins, alkali-soluble resins and light absorbers as disclosed in JP-B-7-69611 (the term "JP-B" as used herein refers to an "examined Japanese patent publication"), reaction products of maleic anhydride copolymers and diamine-type light absorbers as disclosed in U.S. Pat. No. 5,294,680, antireflection films containing resin binders and methylolmelamine series thermal crosslinking agents as disclosed in JP-A-6-118631, acrylic resin type antireflection films having a carboxylic acid group, an epoxy group and a light-absorbing group in the same molecule as disclosed in JP-A-6-118656, antireflection films comprising methylolmelamine and benzophenone series light absorbers as disclosed in JP-A-8-87115, and antireflection films obtained by adding low molecular weight light absorbers to polyvinyl alcohol resins as disclosed in JP-A-8-179509 are exemplified.

As organic antireflection films, commercially available products such as DUV-30 series and DUV-40 series manufactured by Brewer Science, and AR-2, AR-3 and AR-5 manufactured by Shipley Co. can also be used.

In a pattern forming process on a resist film in the manufacture of precision integrated circuit elements, the positive resist composition of the invention is coated on a substrate (e.g., a silicon/silicon dioxide coated substrate, a glass substrate, an ITO substrate, a quartz/chromium oxide coated substrate, etc.) to form a resist film, and the resist film is subjected to irradiation with actinic ray or radiation such as KrF excimer laser rays, electron beams, EUV rays, etc., heating, development, rinsing, and drying, whereby a good resist pattern can be formed.

As alkali developers for use in a development process, alkaline aqueous solutions (generally from 0.1 to 20 mass %) of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, choline, etc., and cyclic amines, e.g., pyrrole, piperidine, etc., can be used. An appropriate amount of alcohols, e.g., isopropyl alcohol, etc., and nonionic surfactants may be added to the aqueous solutions of alkalis.

Of these developers, quaternary ammonium salts are preferred, and tetramethylammonium hydroxide and choline are more preferred.

The pH of the alkali developer is generally from 10 to 15.

EXAMPLE

The invention will be described in further detail with reference to examples, but the invention is not limited thereto.

Synthesis Example 1

A mixture comprising 60/40 in a molar ratio of t-butoxystyrene and α-hydroxybutyllactone methacrylate (20 g) was dissolved in tetrahydrofuran (THF) to prepare 22 mass % of a solution (91 g). To the solution was further added 2 mol % of polymerization initiator V601 (manufactured by Wako Pure Chemical Industries) to make homogeneous, and the solution was dropped to THF (9 g) refluxing with heating over 6 hours. After completion of dropping, the reaction solution was further refluxed with heating for 2 hours. After completion of the reaction, the reaction solution allowed to cool was put into 1 liter of water. Precipitated white powder (Resin A) was recovered. The molecular weight of Resin A measured by GPC was 10,100 in polystyrene equivalent.

Resin A was again dissolved in propylene glycol monomethyl ether (PGME) to prepare a 20 mass % solution. Sulfuric acid (1 ml) was added to the above solution, the solution was heated at 50° C. for 3 hours, and after cooling, reprecipitated in 1 liter of water, and the precipitated white powder (Resin B) was recovered.

After the recovered Resin B was dried at 80° C. under reduced pressure, 14 g of Resin B was dissolved in 60 g of propylene glycol monomethyl ether acetate (PGMEA), and subjected to azeotropic dehydration. Subsequently, 2.2 g of ethyl vinyl ether, and 0.1 g of paratoluenesulfonic acid pyridinium salt (PPTS) were added thereto, and the reaction system was stirred at room temperature for 4 hours. After the obtained solution was quenched with 0.1 g of triethylamine, 50 ml of ethyl acetate was added, extracted with 30 ml of water three times, and distilled under reduced pressure, whereby an objective product (Resin (1)) of a PGMEA solution was recovered. As a result of measurement after loss on drying, the solids content was 16 g, and the concentration of the solids content was 20 mass %. The ratio of the composition of Resin (1) by 1H NMR measurement of hydroxystyrene/ethyl vinyl ether protection of hydroxystyrene/α-hydroxybutyrolactone methacrylate was 32/28/40. The molecular weight of Resin (1) measured by GPC was 10,800 in polystyrene equivalent, and molecular weight distribution was 2.01.

Resins (2) to (14) and Comparative Resins A and B were synthesized in the same method. The compositional ratios, weight average molecular weights, and molecular weight distributions of Resins (2) to (14) and Comparative Resins A and B are shown in Table 1 below.

TABLE 1

| Resin | Compositional Ratio* | Molecular Weight | Molecular Weight Distribution |
|---|---|---|---|
| (2) | 35/27/38 | 9,700 | 2.06 |
| (3) | 44/25/31 | 9,300 | 1.93 |
| (4) | 41/33/26 | 9,100 | 2.02 |
| (5) | 54/34/12 | 8,700 | 1.99 |
| (6) | 41/35/24 | 9,200 | 2.11 |
| (7) | 35/31/25/9 | 8,300 | 1.89 |
| (8) | 42/36/22 | 9,700 | 2.07 |
| (9) | 45/32/15/8 | 9,600 | 2.02 |
| (10) | 32/31/25/12 | 9,300 | 1.99 |
| (11) | 41/33/26 | 8,100 | 1.89 |
| (12) | 39/10/18/33 | 8,500 | 2.17 |
| (13) | 30/12/20/38 | 8,400 | 1.91 |
| (14) | 40/10/21/29 | 8,700 | 1.92 |

TABLE 1-continued

| Resin | Compositional Ratio* | Molecular Weight | Molecular Weight Distribution |
|---|---|---|---|
| Comparative Resin A | (structure: p-hydroxystyrene / p-(1-ethoxyethoxy)styrene) 73/ 27 | 9,500 | 2.06 |
| Comparative Resin B | (structure: p-hydroxystyrene / 2-adamantyl-2-methacryloyloxypropane) 74/ 26 | 8,500 | 1.95 |

Resin (1') having the same repeating units and the same composition with Resin (1) was synthesized with referring to JP-A-2004-352989. The weight average molecular weight was 11,000 and the molecular weight distribution was 1.34.

The sulfonic acid generators and carboxylic acid generators used in Examples were synthesized according to well-known methods, such as JP-A-2002-27806.

Examples 1 to 15 and Comparative Examples 1 and 2

As shown in Table 2 below, each resin, sulfonic acid generator, carboxylic acid generator, organic basic compound and surfactant were dissolved in propylene glycol monomethyl ether acetate (PGMEA) to prepare a solution having solids content concentration of 12 mass %. The solution was filtered through a polyethylene filter having a pore diameter of 0.05 μm, whereby an objective positive resist solution was prepared.

Antireflection film DUV-44 (manufactured by Brewer Science) was uniformly coated on a silicone substrate in a thickness of 60 nm with a spin coater, and dried by heating at 200° C. for 60 seconds to form an antireflection film. After that, the prepared positive resist solution was uniformly coated thereon with a spin coater and dried by heating on a hot plate at temperature shown in Table 2 (PB) for 90 seconds to form a resist film having a thickness of 0.3 μm.

The resist film was subjected to pattern exposure through a mask of line and space with a KrF excimer laser stepper (FPA3000EX-5, wavelength: 248 nm, manufactured by Canon Inc.), and immediately after exposure the resist film was heated at temperature shown in Table 2 (PEB) for 90 seconds. Further, the resist film was developed with a 2.38 mass % tetramethyl-ammonium hydroxide aqueous solution at 23° C. for 60 seconds, rinsed with pure water for 30 seconds, and then dried, whereby a line pattern of 130 nm was formed.

The obtained pattern was observed with eCD-1 (manufactured by KLA Tencor Corporation) and measured at 100 points in the wafer, and 3σ was defined as roughness.

Exposure latitude was defined by $100 \times |Eo-Eu|/Eopt$ (%), taking the exposure amount to reproduce 130 nm as Eopt, and the exposure amounts to reproduce 125 nm and 135 nm as Eu and Eo respectively.

The results of evaluations are shown in Table 2.

TABLE 2

| Example | Resin (10 g) | Sulfonic Acid Generator | Carboxylic Acid Generator | Organic Basic Compound | Surfactant (100 ppm in all the solutions) | PB/PEB (° C.) | Roughness (nm) | Exposure Latitude (%) |
|---|---|---|---|---|---|---|---|---|
| 1 | 1 | B-19 (0.75 g) | | D-1 (60 mg) | W-1 | 120/115 | 4.8 | 12 |
| 2 | 2 | B-25 (0.5 g)/ B-82 (0.3 g) | C-13 (50 mg) | | W-2 | 110/110 | 5.0 | 11 |
| 3 | 3 | B-87 (0.8 g) | | D-2 (70 mg) | W-3 | 115/115 | 4.5 | 12 |
| 4 | 4 | B-84 (0.4 g)/ B-17 (0.4 g) | | D-3 (65 mg) | W-1 | 120/120 | 4.5 | 11 |
| 5 | 5 | B-17 (0.8 g) | | D-3 (60 mg) | W-1 | 115/115 | 4.3 | 15 |
| 6 | 6 | B-86 (0.79 g) | C-1 (40 mg) | D-2 (30 mg) | W-3 | 125/125 | 4.6 | 13 |
| 7 | 7 | B-88 (0.82 g) | | D-1 (60 mg) | W-2 | 115/115 | 4.2 | 17 |
| 8 | 8 | B-15 (0.5 g)/ B-4 (0.3 g) | | D-1 (60 mg) | W-1 | 120/120 | 4.6 | 13 |
| 9 | 9 | B-3 (0.85 g) | | D-3 (65 mg) | W-1 | 120/120 | 4.6 | 14 |
| 10 | 10 | B-16 (0.8 g) | | D-1 (60 mg) | W-2 | 125/120 | 4.5 | 16.5 |
| 11 | 11 | B-24 (0.8 g) | | D-3 (80 mg) | W-2 | 115/115 | 5.1 | 11 |
| 12 | 12 | B-85 (0.8 g) | | D-3 (70 mg) | W-3 | 115/115 | 4.6 | 12.5 |
| 13 | 13 | B-85 (0.6 g)/ B-49 (0.4 g) | | D-1 (45 mg)/ D-3 (30 mg) | W-3 | 115/115 | 4.4 | 13 |
| 14 | 14 | B-87 (0.7 g)/ B-58 (0.2 g) | | D-1 (30 mg)/ D-3 (32 mg) | W-1 | 120/115 | 4.6 | 12 |
| 15 | 1' | B-19 (0.75 g) | | D-1 (60 mg) | W-1 | 120/115 | 4.3 | 14 |
| Comp. Ex. 1 | Comp. Resin A | B-19 (0.75 g) | | D-1 (60 mg) | W-1 | 120/115 | 7.5 | 6.2 |
| Comp. Ex. 2 | Comp. Resin B | B-17 (0.8 g) | | D-3 (60 mg) | W-1 | 115/115 | 8.6 | 7.3 |

The abbreviations in Table 2 are as follows.
Organic Basic Compounds:
D-1: N,N-Dibutylaniline
D-2: 2,4,6-Triphenylimidazole
D-3: 2,6-Diisopropylaniline
Surfactants:
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Siloxane polymer KP-341 (silicon surfactant, manufactured by Shin-Etsu Chemical Co., Ltd.)

It is apparently seen from the results shown in Table 2 that the positive resist compositions in the invention are excellent in line edge roughness and exposure latitude.

The invention can provide a positive resist composition showing good line edge roughness and exposure latitude in pattern forming by irradiation with electron beams, KrF excimer laser rays, or EUV rays, and a pattern forming method using the same.

The entire disclosure of each and every foreign patent application from which the benefit of foreign priority has been claimed in the present application is incorporated herein by reference, as if fully set forth.

What is claimed is:

1. A positive resist composition containing:
(A) a compound capable of generating sulfonic acid, bis(alkylsulfonyl)amide, or tris(alkylsulfonyl)methine upon irradiation with actinic ray or radiation; and
(B) a resin capable of increasing its solubility in an alkali developer by action of an acid, the resin comprising a repeating unit represented by formula (a), a repeating unit represented by formula (b) and a repeating unit having an acid-decomposable group represented by formula (c), wherein:

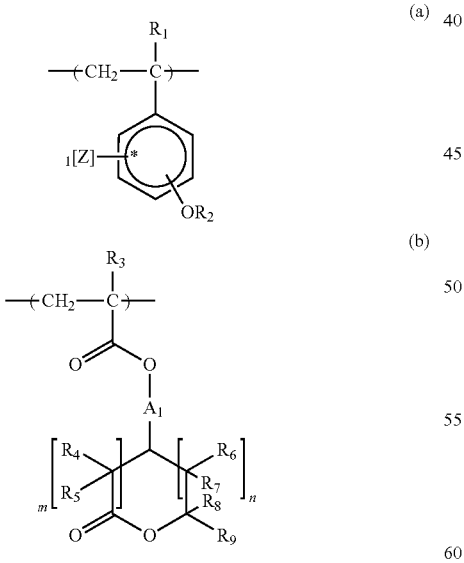

$R_1$ represents a hydrogen atom or an alkyl group;
$R_2$ represents a hydrogen atom;
Z represents a hydroxyl group, a halogen atom, a cyano group, a nitro group, an alkyl group, a cycloalkyl group, an aryl group, an alkoxyl group, an acyl group, or an acyloxy group;
$R_3$ represents a hydrogen atom or an alkyl group; $A_1$ represents a single bond or a divalent linking group;
$R_4$ and $R_5$ each represents a hydrogen atom, a halogen atom, an alkyl group, or an alkoxyl group;
$R_6$, $R_7$, $R_8$ and $R_9$ each represents a hydrogen atom, a halogen atom, an alkyl group, or an alkoxyl group, $R_6$ or $R_7$, and $R_8$ or $R_9$ may be bonded to each other to form a cyclic structure;
l represents from 0 to 4;
m represents 0 or 1;
n represents 0 or 1, provided that m+n represents 1 or 2;
wherein the content of the repeating unit represented by formula (a) is from 30-75 mol % in all the repeating units of the resin of component (B):

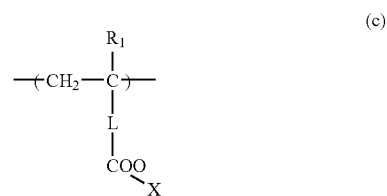

$R_1$ represents a hydrogen atom, a methyl group, a trifluoromethyl group, a cyano group, a chlorine atom, a hydroxymethyl group, or an alkoxymethyl group;
L represents a single bond or a divalent linking group;
X represents a group having a partial structure containing an alicyclic hydrocarbon represented by formula (pI):

wherein $R_{11}$ represents a methyl group, an ethyl group, an n-propyl group, an isopropyl group, an n-butyl group, an isobutyl group, or a sec-butyl group; and
Z in formula (pI) represents an atomic group necessary to form a monocyclic alicyclic hydrocarbon group together with a carbon atom.

2. A pattern forming method comprising:
forming a resist film with the positive resist composition as claimed in claim 1;
and exposing and developing the resist film.

3. The positive resist composition as claimed in claim 1, wherein the compound (A) is selected from the group consisting of compounds represented by the formulae (ZI), (ZII) and (ZIII),

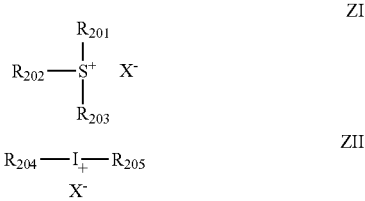

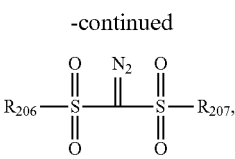

wherein,
the compound of formula (ZI) is selected from the group consisting of compound (ZI-1) and compound (ZI-2);
compound (ZI-1) represents an arylsulfonium compound of formula (ZI) in which at least one of $R_{201}$, $R_{202}$ and $R_{203}$ represents an aryl group;
compound (ZI-2) is a compound of formula (ZI) where $R_{201}$, $R_{202}$ and $R_{203}$ in formula (ZI) each represents an organic group not having a carbocyclic or heterocyclic aromatic ring;
$R_{204}$, $R_{205}$, $R_{206}$ and $R_{207}$ each represents an aryl group, an alkyl group or a cycloalkyl group;
X⁻ represents a sulfonate anion, a bis(alkylsulfony)amide anion, or a tris(alkylsulfonyl)methide anion.

4. The positive resist composition as claimed in claim 1, wherein the content of the repeating unit represented by formula (b) is from 3-50 mol % in all the repeating units of the resin of component (B).

5. The positive resist composition as claimed in claim 1, wherein (A) is a compound capable of generating sulfonic acid or tris(alkylsulfonyl)methane upon irradiation with actinic rays or radiation.

6. A positive resist composition containing:
(A) a compound capable of generating sulfonic acid, bis(alkylsulfonyl)amide, or tris(alkylsulfonyl)methine upon irradiation with actinic ray or radiation; and
(B) a resin capable of increasing its solubility in an alkali developer by action of an acid, the resin comprising a repeating unit represented by formula (a), a repeating unit represented by formula (b) and a repeating unit having an acid-decomposable group represented by formula (c), wherein:

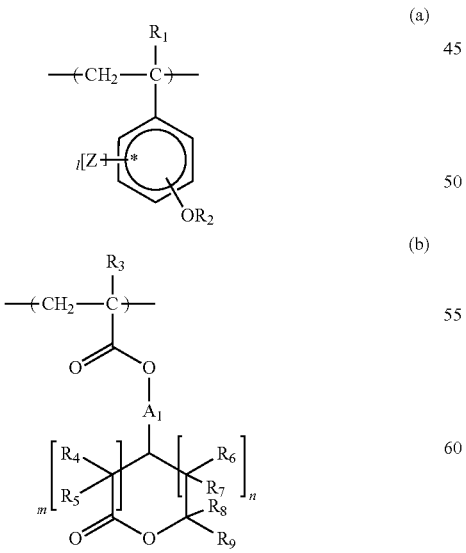

$R_1$ represents a hydrogen atom or an alkyl group;
$R_2$ represents a hydrogen atom;

Z represents a hydroxyl group, a halogen atom, a cyano group, a nitro group, an alkyl group, a cycloalkyl group, an aryl group, an alkoxyl group, an acyl group, or an acyloxy group;

$R_3$ represents a hydrogen atom or an alkyl group; $A_1$ represents a single bond or a divalent linking group;

$R_4$ and $R_5$ each represents a hydrogen atom, a halogen atom, an alkyl group, or an alkoxyl group;

$R_6$, $R_7$, $R_8$ and $R_9$ each represents a hydrogen atom, a halogen atom, an alkyl group, or an alkoxyl group, $R_6$ or $R_7$, and $R_8$ or $R_9$ may be bonded to each other to form a cyclic structure;

l represents from 0 to 4;
m represents 0 or 1;
n represents 0 or 1, provided that m+n represents 1 or 2;
wherein the content of the repeating unit represented by formula (a) is from 30-75 mol % in all the repeating units of the resin of component (B):

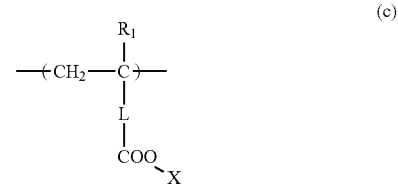

$R_1$ represents a hydrogen atom, a methyl group, a trifluoromethyl group, a cyano group, a chlorine atom, a hydroxymethyl group, or an alkoxymethyl group;
L represents a single bond or a divalent linking group;
X represents a group having a partial structure containing an alicyclic hydrocarbon represented by formula (pI):

wherein $R_{11}$ represents a methyl group, an ethyl group, an n-propyl group, an isopropyl group, an n-butyl group, an isobutyl group, or a sec-butyl group; and
Z in formula (pI) represents an atomic group necessary to form a monocyclic alicyclic hydrocarbon group together with a carbon atom, wherein the resin of component (B) further comprises a repeating unit having an alicyclic hydrocarbon structure substituted with a polar group.

7. The positive resist composition as claimed in claim 6, wherein the polar group is a hydroxyl group or a cyano group.

8. The positive resist composition as claimed in claim 6, wherein the repeating unit having an alicyclic hydrocarbon structure substituted with a polar group is a repeating unit having a partial structure represented by formula (VIIa) or (VIIb)

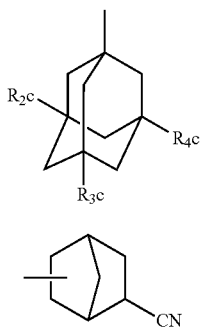

(VIIa)

(VIIb)

in formula (VIIa), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group.

9. The positive resist composition as claimed in claim 8, wherein the repeating unit having a partial structure represented by formula (VIIa) or (VIIb) is a repeating unit represented by formula (AIIa) or (AIIb)

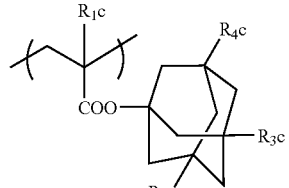

(AIIa)

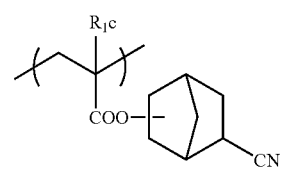

(AIIb)

in formulae (AIIa) and (AIIb), $R_{1c}$ represents a hydrogen atom, a methyl group, a trifluoromethyl group, or a hydroxyl-methyl group.

\* \* \* \* \*